(12) United States Patent
Sato et al.

(10) Patent No.: US 8,130,511 B2
(45) Date of Patent: Mar. 6, 2012

(54) CIRCUIT BOARD DEVICE, WIRING BOARD CONNECTING METHOD, AND CIRCUIT BOARD MODULE DEVICE

(75) Inventors: Junya Sato, Tokyo (JP); Nobuhiro Mikami, Tokyo (JP); Shinji Watanabe, Tokyo (JP); Atsumasa Sawada, Tokyo (JP); Nozomu Nishimura, Tokyo (JP)

(73) Assignee: NEC Corporation, Tokyo (JP)

( * ) Notice: Subject to any disclaimer, the term of this patent is extended or adjusted under 35 U.S.C. 154(b) by 653 days.

(21) Appl. No.: 12/227,059

(22) PCT Filed: May 14, 2007

(86) PCT No.: PCT/JP2007/059830
§ 371 (c)(1),
(2), (4) Date: Nov. 6, 2008

(87) PCT Pub. No.: WO2007/135879
PCT Pub. Date: Nov. 29, 2007

(65) Prior Publication Data
US 2009/0161331 A1 Jun. 25, 2009

(30) Foreign Application Priority Data
May 22, 2006 (JP) ................................. 2006-142149

(51) Int. Cl.
*H05K 1/11* (2006.01)
(52) U.S. Cl. ........ 361/785; 361/784; 361/790; 361/792; 361/804; 439/66
(58) Field of Classification Search ................... 361/784, 361/785, 790, 792, 801–804; 439/91, 66, 439/591
See application file for complete search history.

(56) References Cited

U.S. PATENT DOCUMENTS
4,913,656 A * 4/1990 Gordon et al. .................. 439/67
5,165,984 A * 11/1992 Schoenthaler ................ 428/209
(Continued)

FOREIGN PATENT DOCUMENTS
JP 57-168184 4/1956
(Continued)

OTHER PUBLICATIONS

PCT/IB/338.
(Continued)

*Primary Examiner* — Hoa C Nguyen
(74) *Attorney, Agent, or Firm* — McGinn IP Law Group, PLLC

(57) ABSTRACT

A circuit board device, a wiring board connecting method, and a circuit board module device are provided for controlling a compression ratio of anisotropically conductive members within an optimal range, for restraining variations in the impact resilient force of the anisotropically conductive members even if an increased number of wiring boards are laminated, for restraining deformations of the wiring board and fluctuations in the impact resilient force of the anisotropically conductive members even if a static external force or the like is applied, for suppressing a linear expansion of the anisotropically conductive members, even if the ambient temperature changes, to increase the stability of electric connections, and for reducing the impact resilient force of the anisotropically conductive members to allow for a reduction in thickness. The circuit board device comprises wiring boards 101-104, anisotropically conductive members 105 placed between the individual wiring boards, functional blocks 106 separate from anisotropically conductive members 105 and are placed on the same plane as anisotropically conductive members 105 so as to enclose anisotropically conductive members 105, and a pair of holding blocks 107, 108 placed to sandwich wiring boards 101-104. These wiring boards 101-104 are kept compressed while they are clamped between pair of holding blocks 107, 108, so that they are electrically connected with each other by anisotropically conductive members 105.

20 Claims, 22 Drawing Sheets

U.S. PATENT DOCUMENTS

| | | | |
|---|---|---|---|
| 5,219,293 A | 6/1993 | Imamura | |
| 5,334,029 A * | 8/1994 | Akkapeddi et al. | 439/66 |
| 5,500,280 A * | 3/1996 | Yamazaki et al. | 428/220 |
| 5,662,163 A * | 9/1997 | Mira | 165/80.3 |
| 5,703,753 A * | 12/1997 | Mok | 361/715 |
| 5,917,709 A * | 6/1999 | Johnson et al. | 361/803 |
| 6,183,272 B1 * | 2/2001 | Muller et al. | 439/91 |
| 7,267,559 B2 * | 9/2007 | Hashitani et al. | 439/91 |

FOREIGN PATENT DOCUMENTS

| | | |
|---|---|---|
| JP | 47-29885 | 11/1972 |
| JP | 47-29885(A) | 11/1972 |
| JP | 59-189269 | 12/1984 |
| JP | 63-84097 | 4/1988 |
| JP | 2-76477 | 6/1990 |
| JP | 5-13913 | 1/1993 |
| JP | 5-13913(A) | 1/1993 |
| JP | 8-96870 | 4/1996 |
| JP | 8-307030 | 11/1996 |
| JP | 11-40227 | 2/1999 |
| JP | 11-40227(A) | 2/1999 |
| JP | 2001-244592 | 9/2001 |
| JP | 2002-8749 | 1/2002 |
| JP | 2003-77559 | 3/2003 |
| JP | 2005-347558 | 12/2005 |

OTHER PUBLICATIONS

PCT/IB/373.
PCT/ISA/237 with English-Language Translation.
Chinese Office Action dated May 25, 2010 with English-language translation.
Japanese Office Action dated Nov. 7, 2011 with partial English translation.

* cited by examiner

CIRCUIT BOARD DEVICE, WIRING BOARD CONNECTING METHOD, AND CIRCUIT BOARD MODULE DEVICE

TECHNICAL FIELD

The present invention mainly relates to a circuit board device which has a plurality of wiring boards applied with printed wires, such as flexible printed wiring boards, rigid printed wiring boards or the like equipped in electronic devices in the electric and communication fields, where the wiring boards are laminated and held in connection with each other. Further, the present invention relates to a wiring board connecting method for connecting these wiring boards to each other, and a circuit board module device.

BACKGROUND ART

Recently, for example, portable telephones, PDA (Personal Digital Assistant) terminals, and many other electronic devices comprises a plurality of printed wiring boards, which are applied with printed wires and mounted with a lot of electronic parts, and which are contained in a limited volume of electronic devices. Then, with an increasing reduction in thickness and volume, a variety of technologies have been disclosed as method of laminating a plurality of these printed wiring boards and holding them in connection with each other, in order to realize a reduction in size of printed wiring boards.

FIG. 1 is a schematic cross-sectional view showing the structure of connections in a printed board disclosed in JP-8-96870-A. According to the technology described in detail in this figure, first printed board 1304, second printed board 1305, and third printed board 1306 are laminated on first resilient member 1303 embedded in base 1301, while being positioned by guide rod members 1302 disposed on base 1301. Then, intermediate plate member 1307 is fixed to base 1301 with screws from above them. Further, fourth printed board 1308, fifth printed board 1309, and sixth printed board 1310 are laminated from above intermediate plate member 1307 while being positioned by guide rod members 1302. Resilient members 1311 are disposed from above sixth printed board 1310 at sites corresponding to portions of these printed boards which have conductive patterns, and board keep plate 1312 is fixed to intermediate plate member 1307 by screws from above resilient member 1311. In this way, first printed board 1304, second printed board 1305, and third printed board 1306 are connected by the impact resilient force of resilient member 1303 and resilient member 1311 with their conductive patterns brought into contact with each other. Likewise, fourth printed board 1308, fifth printed board 1309, and sixth printed board 1310 are connected by the impact resilient force of resilient member 1303 and resilient member 1311 with their conductive patterns brought into contact with each other.

FIG. 2 in turn is a schematic cross-sectional view showing the structure of connections in a printed board disclosed in JP-8-307030-A. According to the technology described in detail in this figure, rigid board base 1405 is mounted with one-side flexible printed board (FPC: Flexible Printed Circuit) 1401 formed with conductor 1402 on a surface thereof, and two-side FPC 1403 is laminated thereon, with conductor 1404 formed on a back surface and conductor 1409 is formed on a front surface. Anisotropically conductive rubber 1406, which is a resilient member, is disposed from above two-side FPC 1403 at sites corresponding to portions of these printed boards which have conductive patterns. Further, rigid one-side hard board (PWB: Printed Wire Board) 1407 is laminated from above anisotropically conductive rubber 1406 with conductor 1410 formed on a back surface thereof. This one-side PWB 1407 is secured to board base 1405 with fastening of screws 1408 to apply uniform pressure to the entireties of these wiring boards, thereby sufficiently crushing anisotropically conductive rubber 1406 to develop conductivity. In this way, conductor 1402 formed on the front surface of one-side FPC 1401 is electrically connected to conductor 1404 formed on the back surface of two-side FPC 1403, and conductor 1409 formed on the top surface of two-side FPC 1403 is electrically connected to conductor 1410 formed on the back surface of one-side PWB 1407.

FIG. 3 in turn is a schematic exploded perspective view showing a method of pressure connecting flexible circuit boards, disclosed in JP-2001-244592-A. According to the technology described in detail in this figure, mount 1501 is provided on a body base, and mount 1501 is formed with recess 1501a in a central region thereof. Pressure connection rubber 1502 is attached to this recess 1501a. Flexible circuit boards 1503, 1504, 1505, and tongue piece 1506 formed on flexible circuit board 1503 are laminated from above them, and are positioned to the body base through pins 1507a and 1507b formed on mount 1501. Pressure connection fixture 1508 formed with a protrusion is attached by screw member 1509 with the protrusion facing pressure connection rubber 1502, thereby electrically connecting contact patterns formed on laminated flexible circuit boards 1503, 1504, and 1505 as well as tongue piece 1506, respectively, to be in contact with each other, with the resilient force of resiliently deformed pressure connection rubber 1502 and with the pressure of pressure connection fixture 1508 applied to the protrusion.

FIG. 4 in turn is a schematic cross-sectional view showing the structure of a connection using an electric connector, disclosed in JP-2002-8749-A. According to the technology described in detail in this figure, on metal made back-up plate 1601 having a positioning pin 1603 implanted thereon, mounting circuit board 1604 is positioned and horizontally mounted. Mounting circuit board 1604 has an outside shape larger than back-up plate 1601, and comprises a plurality of electrodes 1605 arranged in a matrix in a central region of a surface of its own. On the top, matching plate 1608 is laminated. Rectangular opening 1609 is formed at the center of this matching plate 1608, and contains insulating resilient sheet 1613 which is formed with electric connector 1612 and which has a thickness larger than the thickness of matching plate 1608 by 0.05 to 0.1 mm.

Electric connector 1612 comprises a plurality of resiliently deformable resilient connection pins 1614 which are arranged on a surface of resilient sheet 1613 and which protrude in the direction in which semiconductor package 1630 is mounted. Each resilient connection pin 1614 contains a plurality of metal ribbons 1615, both ends of which protrude or are exposed. From above this, positioning plate 1617 is laminated, and from above this, positioning holder 1621 having opening 1622 is laminated. Then, positioning holder 1621, positioning plate 1617, matching plate 1608, mounting circuit board 1604, and back-up plate 1601 are integrated by screwing a plurality of bolts into them. Subsequently, semiconductor package 1630 having a plurality of electrodes 1631 formed on a back surface thereof is contained and compressed in opening 1622. In this way, resilient sheet 1613 of electric connector 1612 is compressed and deformed, causing mounting circuit board 1604 and semiconductor package 1630, opposing each other, to be electrically connected.

FIG. 5 in turn is a schematic cross-sectional view showing the applied product of an anisotropically conductive connector disclosed in JP-2003-77559-A. According to the detailed description of the applied product of the anisotropically conductive connector disclosed in this figure, anisotropically conductive connector 1702 is placed on circuit board 1755 such that conductor 1722 of resilient anisotropically conductive film 1720 is located on electrode 1756 of circuit board 1755. On this anisotropically conductive connector 1702, electronic part 1750 is placed such that its electrode 1751 is located on conductor 1722 on resilient anisotropically conductive film 1720 of anisotropically conductive connector 1702. Anisotropically conductive connector 1702 comprises frame plate 1710 having an opening formed at the center thereof, and resilient anisotropically conductive film 1720 having conductivity in a thickness direction is placed in this opening while it is supported by the edge of the opening of frame plate 1710. Also, frame plate 10 is formed with a plurality of positioning holes 1716 around its peripheral edge.

Resilient anisotropically conductive film 1720 comprises a functional area which includes a plurality of conductors 1722 which are arranged in accordance with a pattern corresponding to the pattern of electrode 1751 of electronic part 1750 and which extend in the thickness direction, and insulators 1723 formed around each conductor 1722 to insulate each conductor 1722 from one another. This functional area is placed such that it is located in the opening of frame plate 1710. Around the peripheral edge of this functional area, a supported area securely supported by the edge of the opening in frame plate 1710 is formed continuously to the functional area.

As described above, circuit board 1755, anisotropically conductive connector 1702, and electronic part 1750 are laminated. Then, from above this, a leg of fixing member 1752 is inserted through positioning hole 1716 and positioning hole 1757 formed through circuit board 1755, and electronic part 1750 and anisotropically conductive connector 1702 are fixed on circuit board 1755 such that conductor 1722 on resilient anisotropically conductive film 1720 is sandwiched between electrode 1751 of electronic part 1750 and electrode 1756 of circuit board 1755. In this way, conductor 1722 of resilient anisotropically conductive film 1720 develops conductivity, causing electrode 1751 of electronic part 1750 to be electrically connected to electrode 1756 of circuit board 1755.

However, the foregoing conventional technologies imply the following problems. In the technology disclosed in JP-8-96870, the connection of the printed boards with each other is made through contacts of the conductive pattern with each other, and this contact pressure is generated only by the resilient force of the resilient members disposed on the topmost and lowermost layers of the circuit board device. For this reason, the contact area is not consistent due to variations in the shape of terminals of the conductor pattern, particularly, the thickness, area and the like thereof, resulting in an instable electric resistance.

Also, when the printed wiring board deforms due to an external force or the like, the structure is not such that the deformation of the printed wiring board is not transmitted to the resilient members. Thus, the resilient members also deform in association with the deformation of the printed wiring board, resulting in fluctuations in resilient force, i.e., contact pressure and a consequently instable electric resistance.

Further, since the circuit board device is structured such that the base which is embedded with the resilient member and the base keep plate are disposed on the topmost and lowermost layers thereof, it is difficult to realize compactization associated with a reduction in thickness and volume of an electronic device which has this structure. Further, since the connection structure of a plurality of printed wiring boards is electrically disrupted by a plurality of connect layers with the intermediate plate member sandwiched therebetween, a separate connection structure is required for electrically connecting a plurality of these connect layers with each other. In particular, when an increased number of printed wiring boards is to be laminated, it is difficult to realize the compactization associated with a reduction in thickness and volume of an electronic device which has this structure.

On the other hand, in the technology disclosed in JP-8-307030-A, a plurality of printed wiring boards are connected to each other by combining the contacts of the conductive patterns with each other, making use of the resilient force of the anisotropically conductive rubber with the contacts of the conductive patterns that make use of the pressing force of one-side of the hard board. As such, the contact area is not consistent due to variations in the shape of terminals of the conductive patterns in the contact connections, particularly, the thickness, area and the like, resulting in instable electric resistance. In particular, when a plurality of layers of contact connections are provided, the variations are multiplied, causing the electric resistance to be further instable.

Also, when the printed wiring board deforms due to an external force or the like, the structure is not such that the deformation of the printed wiring board is not transmitted to the anisotropically conductive rubbers. Thus, the anisotropically conductive rubbers also deform in association with the deformation of the printed wiring board, resulting in fluctuations in resilient force, i.e., contact pressure, a consequently instable electric resistance, and a possible break.

Further, in a region in which the printed wiring boards are connected to each other by making use of the resilient force of the anisotropically conductive rubber, a large shift appears between the connections of the printed wiring boards and the anisotropically conductive rubber due to the difference in the coefficient of linear expansion between the printed wiring boards and the anisotropically conductive rubber, resulting in an instable electric resistance and possible failures such as signal shorting or break. This problem can arise when the ambient temperature changes between −40° C. and 80° C., which is the storage temperature guaranteed range, required for small electronic devices such as portable telephones in particular.

On the other hand, in the technology disclosed in JP-2001-244592-A, a plurality of printed wiring boards are connected to each other through contacts in the conductive patterns that are in contact with each other, by making use of the resilient force of the pressure connection rubbers. For this reason, the contact area is not consistent due to variations in the shape of terminals of the conductive patterns in the contact connections, particularly, the thickness, area and the like, resulting in an instable electric resistance. In particular, when a plurality of layers of contact connections are provided, the variations are multiplied, causing the electric resistance to be further instable.

Also, when the printed wiring board deforms due to an external force or the like, the structure is not such that the deformation of the printed wiring board is not transmitted to the pressure connection rubber. Thus, the pressure connection rubber also deforms in association with the deformation of the printed wiring board, resulting in fluctuations in resilient force, i.e., contact pressure, a consequently instable electric resistance, and a possible break.

Also, when an increased number of printed wiring boards is to be laminated, the connection pressure rubber must be increased in hardness, or the connection pressure rubber must be increased in size to increase the resilient force, in order to generate a larger pressure force for ensuring electric connection through the contacts of the conductive patterns that are in contact with each other. Accordingly, it is difficult to realize the compactization associated with a reduction in thickness and volume of an electronic device which has this structure.

On the other hand, in the technology disclosed in JP-2002-8749-A, the mounting circuit board and semiconductor package are connected by making use of the resilient force of the resilient connection pins and the metal ribbons embedded in the resilient connection pins. This is not a structure which prevents deformations of the mounting circuit board and semiconductor package from being transmitted to the resilient connection pins if the mounting circuit board and semiconductor package deform due to an external force or the like. Thus, the resilient connection pins also deform in association with the deformation of the mounting circuit board and semiconductor package, resulting in fluctuations in resilient force, i.e., contact pressure, a consequently instable electric resistance, and a possible break.

On the other hand, in the technology disclosed in JP-2003-77559-A, the electrode of the circuit board is connected to the electrode of the electronic part by sandwiching the resilient anisotropically conductive film supported by the edge of the opening of the frame plate. For this reason, when the resilient anisotropically conductive film is sandwiched, a repellent force is generated by this resilient anisotropically conductive film, so that the thickness in the laminating direction must be increased in order to prevent deformations due to this repellent force. In other words, it is difficult to realize the compactization associated with a reduction in thickness and volume of an electronic device which has this structure.

DISCLOSURE OF THE INVENTION

The object of the present invention, which has been made in view of the foregoing problems, is to control a compression ratio of an anisotropically conductive member for electrically connecting respective wiring boards to each other in an optimal range to suppress variations in impact resilient force of the anisotropically conductive member even if an increased number of wiring boards are laminated. It is another object of the present invention to suppress variations in deformation of wiring boards and impact resilient force of the anisotropically conductive member even if a static external force or the like is applied, to suppress the linear expansion of the anisotropically conductive member to maintain the stability of electric connections between the wiring boards, even if the ambient temperature changes, and to reduce the impact resilient force in a direction in which the anisotropically conductive member becomes compressed to realize a reduction in thickness.

A circuit board device according to the present invention includes a plurality of wiring boards, an anisotropically conductive member placed between the respective wiring boards, a functional block separate from the anisotropically conductive member, placed on both sides of the anisotropically conductive member in one direction or in the same plane as the anisotropically conductive member so as to surround the same, and a pair of holding blocks placed to clamp the plurality of wiring boards, and is characterized in that the plurality of wiring boards are kept compressed by being clamped by the pair of holding blocks such that the plurality of wiring boards are electrically connected to each other by the anisotropically conductive members.

In the circuit board device according to the present invention, since the functional block is placed on both sides of the anisotropically conductive member in one direction or is placed to surround the same, the functional block controls the compression ratio of the anisotropically conductive member in an optimal range, so that even if an increased number of wiring boards are laminated, a plurality of anisotropically conductive members have an uniform compression ratio. Accordingly, it is possible to provide a circuit board device which exhibits highly stable electric connections between the wiring boards with restrained variations in impact resilient force. Also, even if a static external force or the like is applied, the functional blocks placed between the wiring boards restrain deformations of the respective wiring boards, and thereby restrain fluctuations in the impact resilient force of the anisotropically conductive members, so that highly stable electric connections are provided between the wiring boards. Also, even if the ambient temperature varies, the functional block restrains a linear expansion of the anisotropically conductive member in a direction in which the functional block is placed, thus making it possible to provide a circuit board device which exhibits high stability of electric connections between the wiring boards without producing a large shift between the wiring boards and the anisotropically conductive members. Also, with the functional block is placed on both sides of the anisotropically conductive member in one direction or is placed to surround the same, when the anisotropically conductive members are compressed by keeping the pair of holding blocks compressed, it is possible to prevent the impact resilient force from being excessively developed by the anisotropically conductive member in a compression direction. As a result, the holding blocks need not be increased in thickness, so that a thin circuit board device can be realized.

The shape of the functional block described above can be the shape of a frame which comprises an opening for fitting the anisotropically conductive member therein. However, the frame shape need not be an exactly rectangular frame shape, but may have a shape which surrounds the anisotropically conductive member. Specifically, with the anisotropically conductive member fitted in the opening, the area of a contact surface with the wiring board expands within the opening when the anisotropically conductive member is compressed, thereby making it possible to prevent the impact resilient force from being excessively applied in the compression direction by the anisotropically conductive member. Also, when the ambient temperature varies, the functional block restrains a linear expansion of the anisotropically conductive member, so that stable electric connections can be made between the wiring boards without a large shift occurring between the wiring board and the anisotropically conductive member.

The shape of the functional block can also be a U-shape to surround three sides of the anisotropically conductive member. However, the U-shape need not be an exact "U" shape, but may have a shape to surround three sides of the anisotropically conductive member or have a shape which can restrict two opposing sides of the anisotropically conductive member. In this way, when the anisotropically conductive member is compressed, the area of a contact surface having the wiring board expands on one side or two sides which are not restricted by the anisotropically conductive member, thereby making it possible to prevent the impact resilient force from being excessively applied in the compression direction by the anisotropically conductive member. Also, when the ambient temperature varies, the functional block restrains a linear expansion of the anisotropically conductive member, so that stable electric connections can be made between the wiring boards without a large shift occurring between the wiring board and the anisotropically conductive member.

Also, as the functional block, two blocks may be used for restraining the positions of two opposing sides of the anisotropically conductive member. In this way, the area of the contact surface with the wiring board expands on two sides which are not restricted by the anisotropically conductive member when the anisotropically conductive member is compressed, thereby making it possible to prevent a impact resilient force from excessively applied in the compression direction by the anisotropically conductive member. Also, when the ambient temperature varies, the functional block restrains a linear expansion of the anisotropically conductive member, so that stable electric connections can be made between the wiring boards without a large shift occurring between the wiring board and the anisotropically conductive member.

A wiring board can be selected from a group consisting of a multi-layer flexible printed wiring board, a multi-layer rigid printed wiring board, a two-side flexible printed wiring board, a two-side rigid printed wiring board, a one-side flexible printed wiring board, and a one-side rigid printed wiring board for use as the plurality of wiring boards.

The anisotropically conductive member can comprise an electrically conductive material made of a metal thin line selected from a group consisting of a gold line, a copper line, a brass line, a phosphor bronze line, a nickel line, and a stainless steel line or conductive particles selected from a group consisting of metal particles, gold-plated particles, silver-plated particles, and copper-plated particles, and an insulator made of an insulating elastic resin material.

The circuit board device according to the present invention can be mounted with arbitrarily selected anisotropically conductive members having different thicknesses. In this way, the distance between the wiring boards can be arbitrarily selected in accordance with the height of parts mounted on each wiring board, resulting in a larger width for selection of mounted parts which can be mounted on each wiring board. Also, problems are less likely to occur due to mounted parts coming into contact with each other on wiring boards, and the like.

Also, a composite inherent period of the functional block and the pair of holding blocks is preferably set to an instantaneous signal break time or less to restrain. In this way, even if the circuit board device is applied with an impulse-like external force such as a drop and impact force or the like to cause deformation of a wiring board, an instantaneous signal break is less likely to occur because the impact resilient force of the anisotropically conductive member does not fluctuate within a signal break time.

The plurality of wiring boards may be kept compressed by using screws to bind them to each other in a state in which the wiring boards are clamped by the pair of holding blocks.

The plurality of wiring boards may be kept compressed by tab engagement in a state where the wiring boards are clamped by the pair of holding blocks.

The holding blocks can be convexedly curved in the direction in which the anisotropically conductive member compress. In this way, when the anisotropically conductive member is compressed by keeping one pair of holding blocks compressed, a fluctuation of the impact resilient force of the anisotropically conductive member is less likely to occur within the connection surface of each wiring board and the anisotropically conductive member, even if this pair of holding blocks receive a pressure which causes deformation that having a concave shape toward the direction in which the anisotropically conductive member is compressed.

Also, the functional block may vary in thickness such that the functional block is thinner toward the anisotropically conductive member. In this event, when the anisotropically conductive member is compressed by keeping one pair of holding blocks compressed, the impact resilient force caused by the anisotropically conductive member is applied to the end at which the functional block is reduced in thickness. In this way, a moment acts convexedly toward the direction in which the anisotropically conductive member is compressed, making it possible to restrain deformations of the holding blocks. Moreover, a fluctuation of the impact resilient force of the anisotropically conductive member is less likely to occur within the connection surface of each wiring board with the anisotropically conductive member.

A wiring board connecting method according to the present invention is characterized by placing a first wiring board on a first holding block, placing an anisotropically conductive member and a functional block on the first wiring board, placing a second wiring board on the anisotropically conductive member and the functional block, placing an arbitrary number of wiring boards through an anisotropically conductive member and through a functional block in a similar manner, placing a second holding block on a topmost wiring board, and clamping a plurality of wiring boards, anisotropically conductive members and functional blocks by the first holding block and the second holding block, and keeping them compressed to electrically connect a plurality of wiring boards.

A circuit board module device according to the present invention includes a plurality of individual functional module boards having a plurality of mounted parts surface mounted thereon, an anisotropically conductive member placed between the respective individual functional module boards, a functional block separate from the anisotropically conductive member, placed on both sides of the anisotropically conductive member in one direction or in the same plane as the anisotropically conductive member so as to surround the same, and a pair of holding blocks placed to clamp the plurality of individual functional module boards. Then, the module is characterized in that the plurality of individual functional module boards are kept compressed be being clamped by the pair of holding blocks such that the plurality of individual functional module boards are electrically connected to each other by the anisotropically conductive members.

As described above, according to the present invention, since the functional block is placed on both sides of the anisotropically conductive member in one direction or to surround the same, the functional block controls the compression ratio of the anisotropically conductive member within an optimal range, so that the impact resilient forces of the plurality of anisotropically conductive members are restrained from variations even if an increased number of wiring boards are laminated. Accordingly, it is possible to provide a circuit board device which exhibits high stability of electric connections between the wiring boards. Also, even if a static external force or the like is applied, the functional blocks restrain deformations of the respective wiring boards, and thereby restrain fluctuations in the impact resilient force of the anisotropically conductive members, so that highly stable electric connections are provided between the wiring boards. Also, even if the ambient temperature varies, the functional block restrains a linear expansion of the anisotropically conductive member in the direction in which the functional block is placed, thus making it possible to provide a circuit board device which exhibits high stability of electric connections between the wiring boards without producing a large shift between the wiring boards and the anisotropically conductive members.

Further, when a composite inherent period of the functional block having a pair of holding blocks is set to a restrained instantaneous signal break time or less, even if the circuit board device is applied with an impulse-like external force such as a drop and impact force or the like to cause deformation of a wiring board, an instantaneous signal break is less likely to occur because the impact resilient force of the anisotropically conductive member does not fluctuate within a signal break time.

Also, with the functional block placed on both side of the anisotropically conductive member in one direction or placed to surround the same, when the anisotropically conductive member is compressed by keeping one pair of holding blocks compressed, it is possible to prevent the impact resilient force from being excessively applied by the anisotropically conductive member. As a result, the thickness of holding blocks need not be increased in thickness, and a thin circuit board device can be realized. Also, since signal connections are made between the respective wiring boards by compressing the functional block and the anisotropically conductive member which is placed on the same plane as the functional block such that it is sandwiched on both sides in one direction or such that it is surrounded by the functional block, it is possible to provide a circuit board device, a wiring board connecting method, and a circuit board module device which can realize a further reduction in thickness and volume.

BRIEF DESCRIPTION OF THE DRAWINGS

FIG. 6b
A cross-sectional view along A-A line in FIG. 6a.
FIG. 11b
A cross-sectional view along line A-A in FIG. 11a.
FIG. 20b
A cross-sectional view along line A-A in FIG. 20a.

Figure 24A:
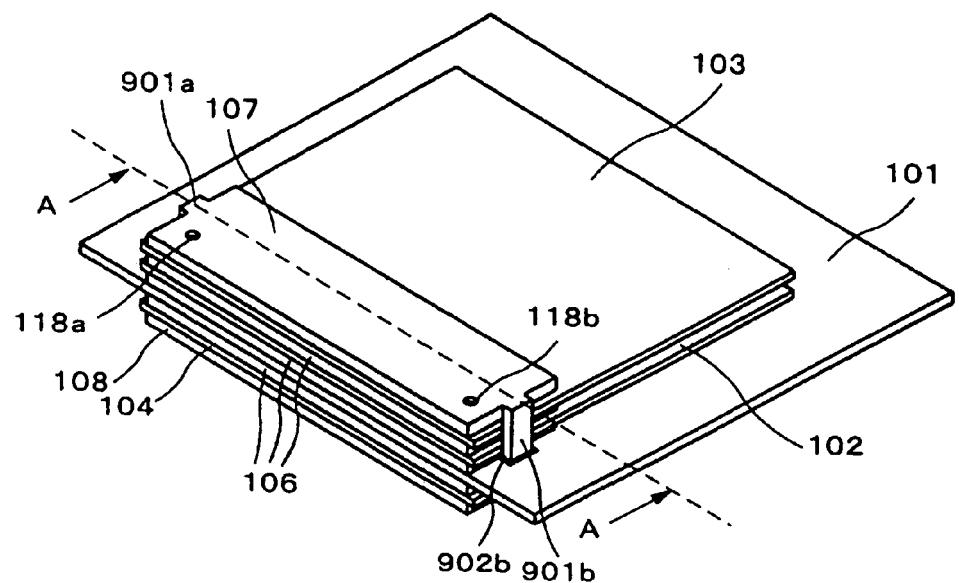
FIG. 24a
A schematic perspective view showing a circuit board device according to a sixth embodiment of the present invention.

A cross-sectional view along line A-A in FIG. 24a.

FIG. 25

An exploded perspective view showing the configuration of the circuit board device and a wiring board connecting method according to the sixth embodiment of the present invention.

FIG. 26

A schematic perspective view showing a circuit board device according to a seventh embodiment of the present invention.

FIG. 27

An exploded perspective view showing the configuration of the circuit board device and a wiring board connecting method according to the seventh embodiment of the present invention.

FIG. 28

A schematic perspective view showing a circuit board device according to an eighth embodiment of the present invention.

FIG. 29

An exploded cross-sectional view showing the configuration of the circuit board device and a wiring board connecting method according to the eighth embodiment of the present invention.

FIG. 30

A schematic perspective view showing a circuit board device according to a ninth embodiment of the present invention.

FIG. 31

An exploded cross-sectional view showing the configuration of the circuit board device and a wiring board connecting method according to the ninth embodiment of the present invention.

BEST MODE FOR CARRYING OUT THE INVENTION

Figure 1:
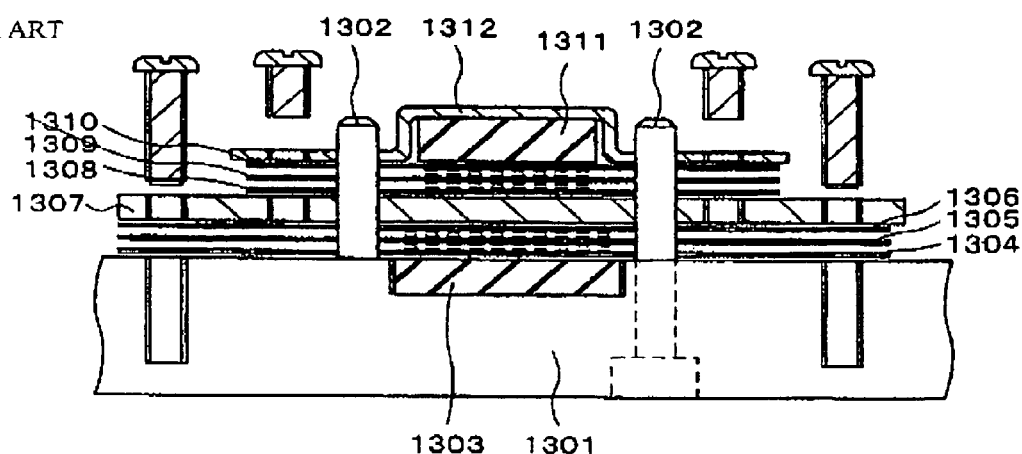
FIG. 1
A schematic cross-sectional view showing the structure of connections in a printed board disclosed in JP-8-96870-A.
Figure 2:
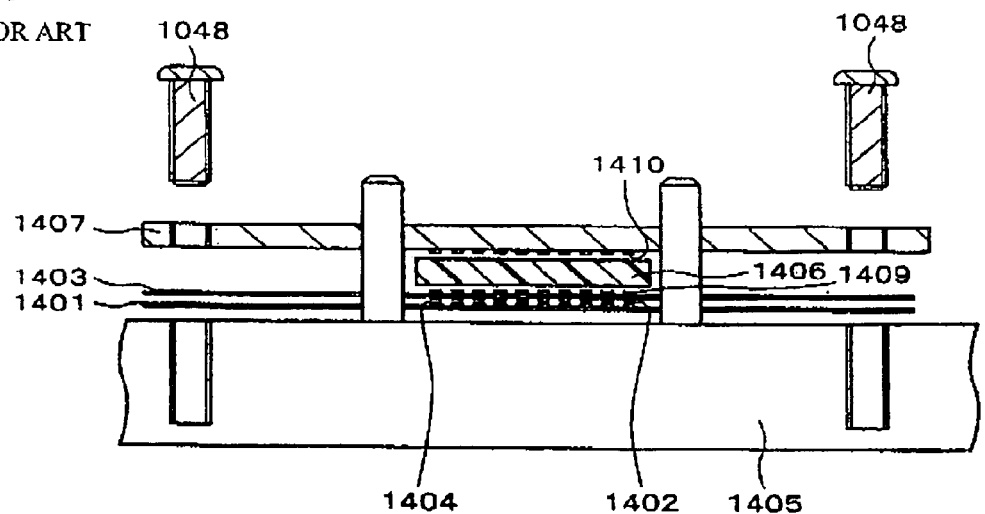
FIG. 2
A schematic cross-sectional view showing the structure of connections in a printed board disclosed in JP-8-307030-A.
Figure 3:
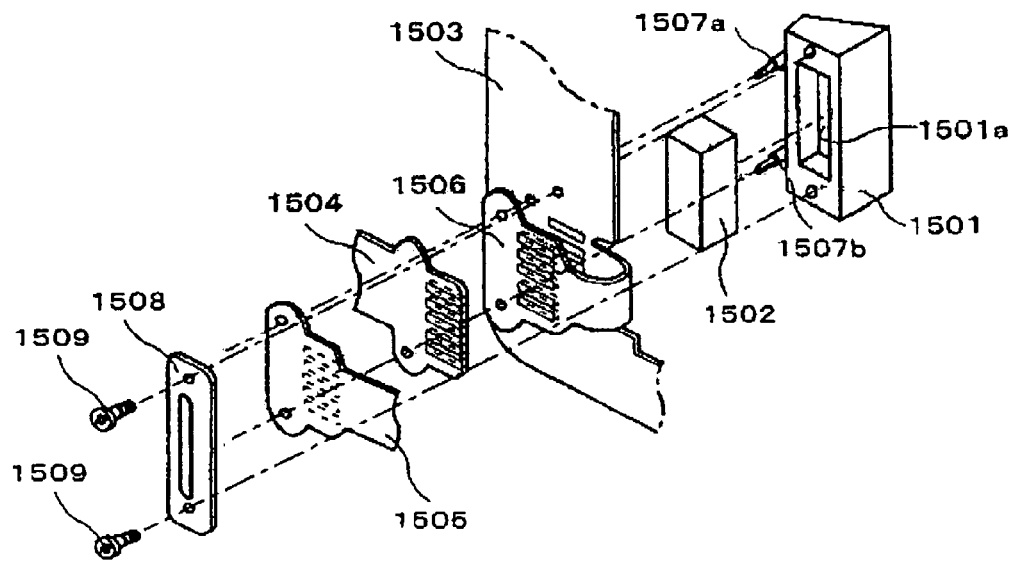
FIG. 3
A schematic exploded perspective view showing a method of pressure connecting flexible circuit boards, disclosed in JP-2001-244592-A.
Figure 4:
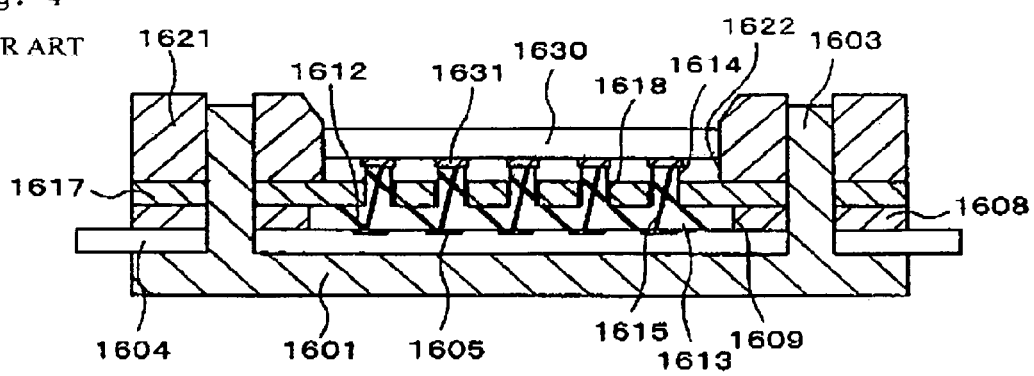
FIG. 4
A schematic cross-sectional view showing the structure of a connection using an electric connector disclosed in JP-2002-8749-A.
Figure 5:
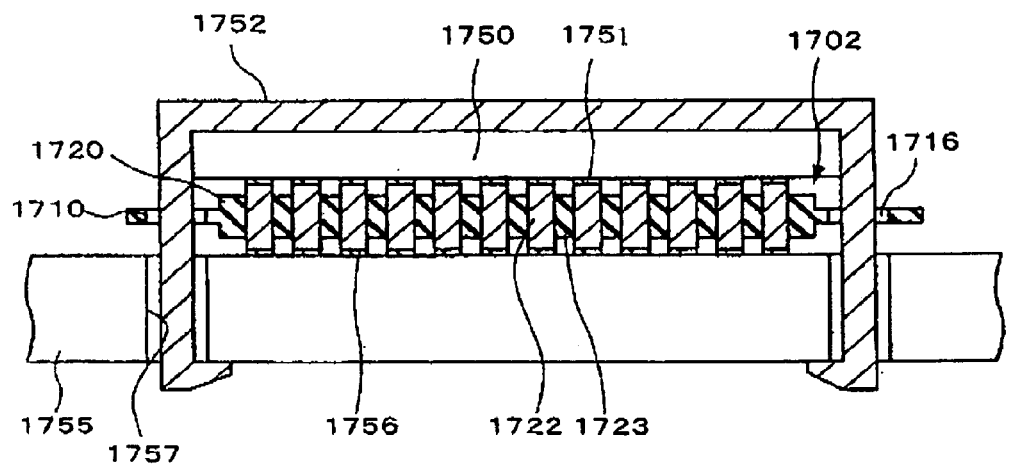
FIG. 5
A schematic cross-sectional view showing an applied product of an anisotropically conductive connector disclosed in JP-2003-77559-A.
Figure 6A:
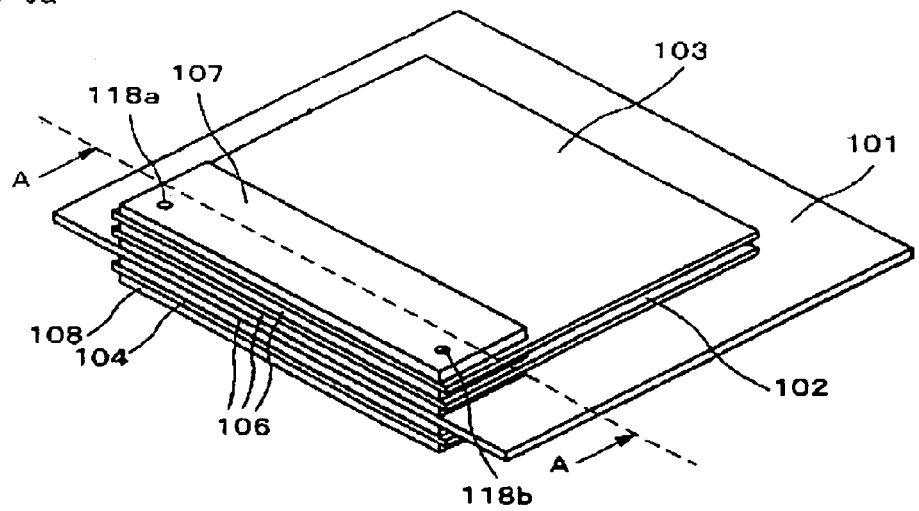
FIG. 6a
A schematic perspective view showing a circuit board device according to a first embodiment of the present invention.
Figure 6B:
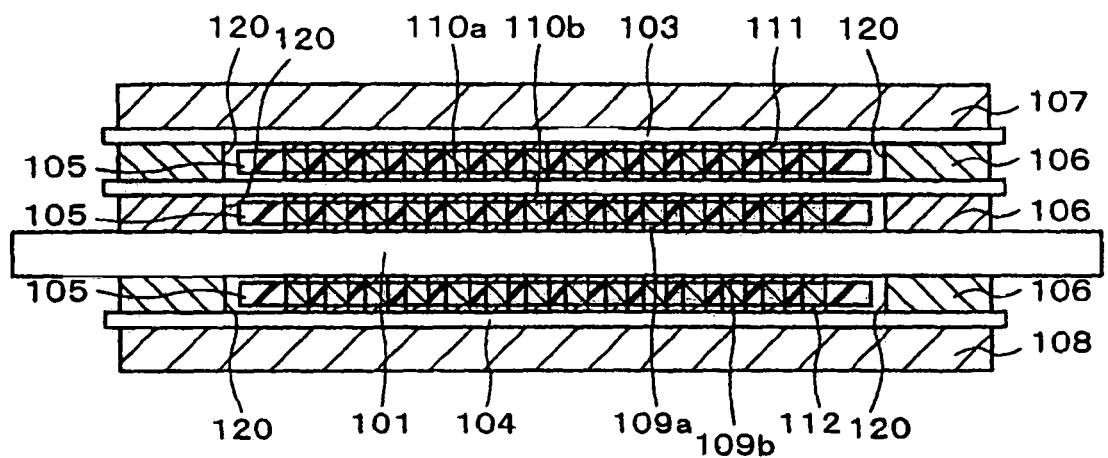
Figure 7:
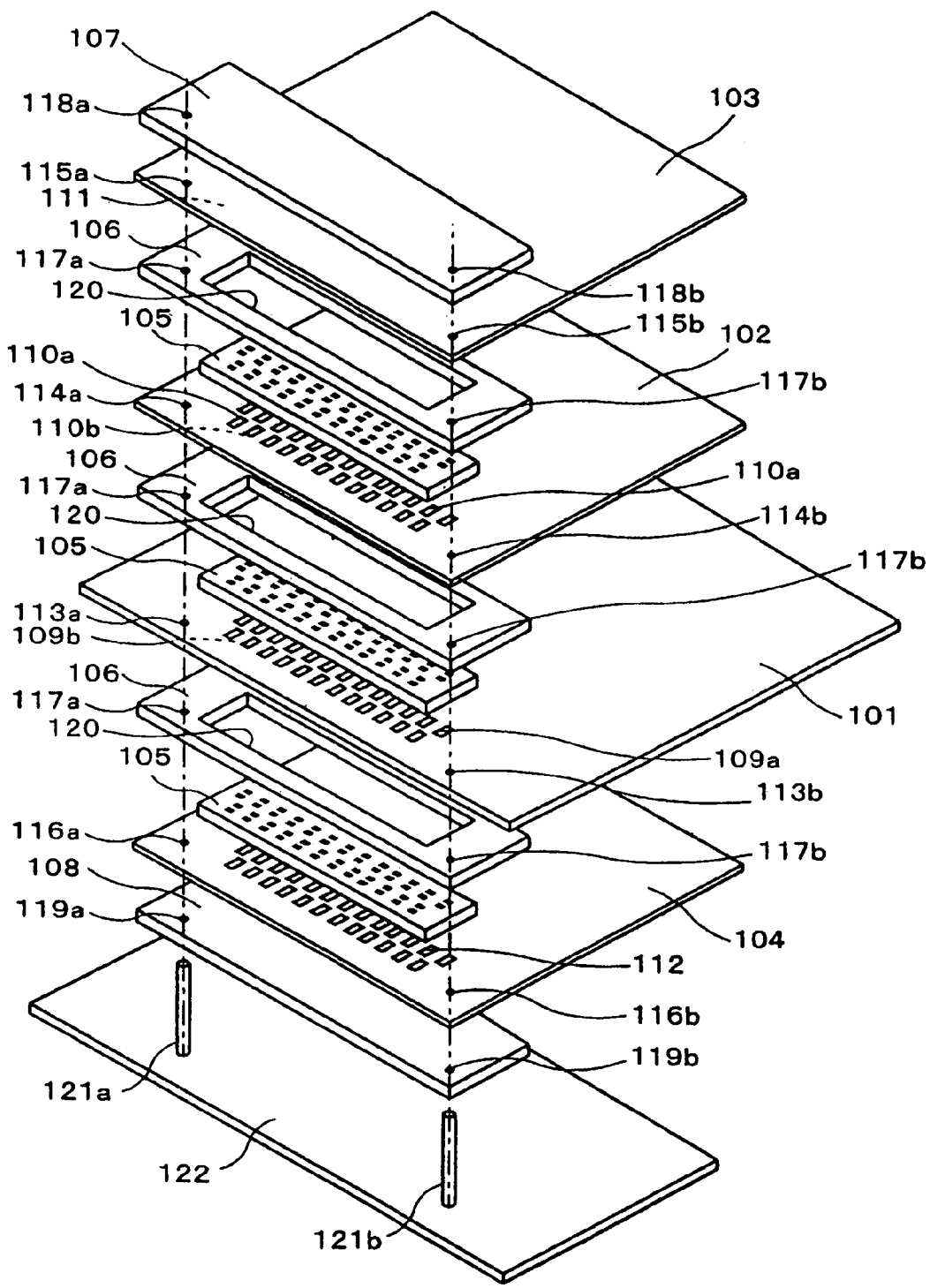
FIG. 7
An exploded perspective view showing the configuration of the circuit board device and a wiring board connecting method according to the first embodiment of the present invention.
Figure 8:
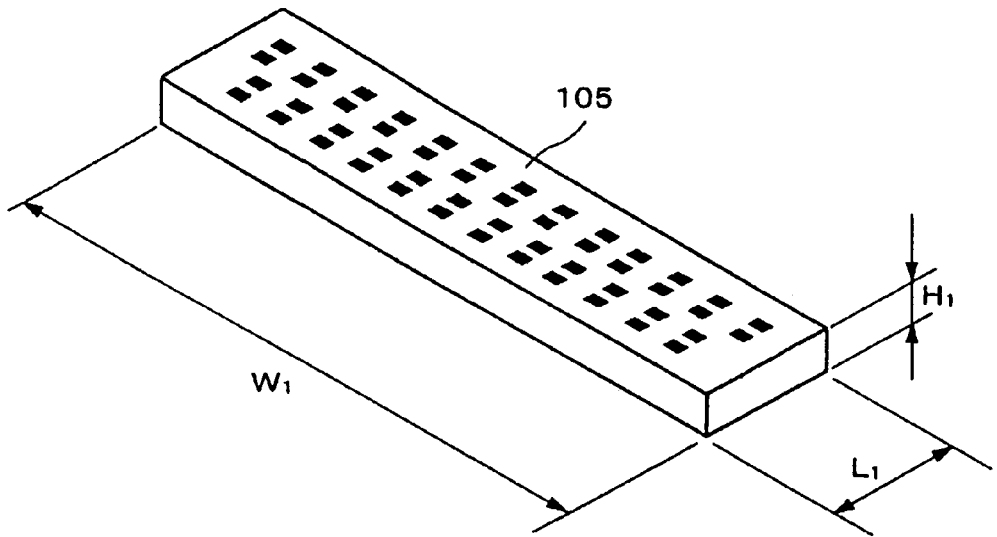
FIG. 8
A schematic perspective view showing anisotropically conductive member 105.
Figure 9:
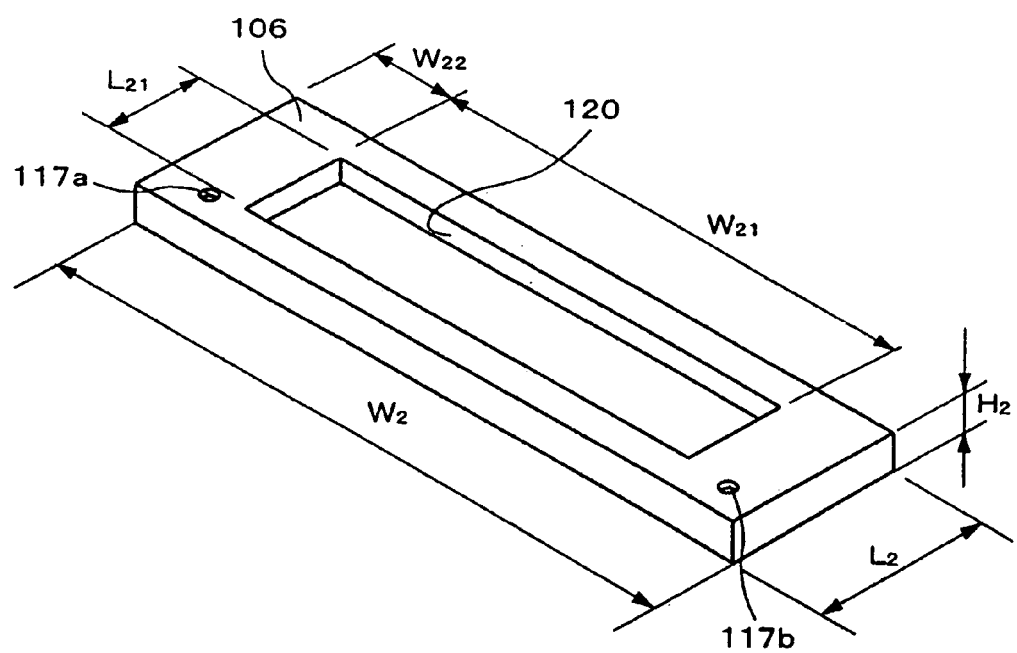
FIG. 9
A schematic perspective view showing functional block 106.
Figure 10:
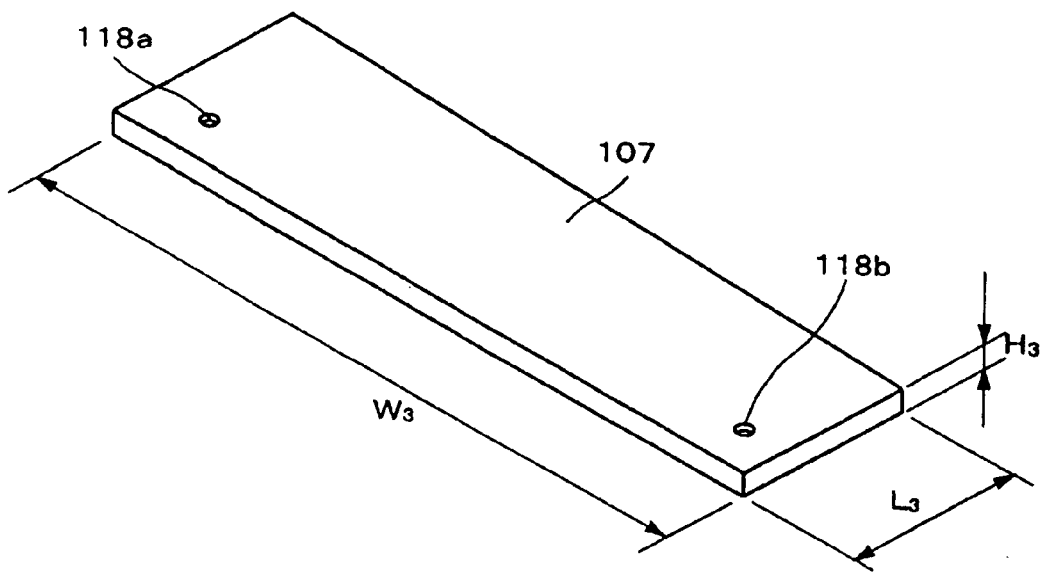
FIG. 10
A schematic perspective view showing holding block 107.

Next, embodiments of the present invention will be specifically described with reference to the accompanying drawings. First, a first embodiment of the present invention will be described. FIG. 6a is a schematic perspective view showing a circuit board device according to this embodiment; FIG. 6b is a cross-sectional view along line A-A in FIG. 6a; FIG. 7 is an exploded perspective view showing the configuration of the circuit board device and a wiring board connecting method according to this embodiment; FIG. 8 is a schematic perspective view showing anisotropically conductive member 105; FIG. 9 is a schematic perspective view showing functional block 106; and FIG. 10 is a schematic perspective view showing holding block 107.

As shown in FIGS. 6a, 6b, the circuit board device according to this embodiment comprises fourth wiring board 104 provided with electrode terminals 112 on a front surface thereof, first wiring board 101 provided with electrode terminals 109b on a back surface and electrode terminal 109a on a front surface, a second wiring board 102 provided with electrode terminal 110b on a back surface and electrode terminals 110a on a front surface, and a third wiring board 103 provided with electrode terminals 111 on a back surface, which are laminated between holding block 108 and holding block 107, with the intervention of functional blocks 106 having anisotropically conductive member 105 fitted therein between the respective wiring boards. Then, pressure is added to cause them to keep anisotropically conductive members 105 compressed, while they are placed between the respective wiring boards, to the thickness of functional block 106 by using a clamp jig (not shown) or the like. In this way, the circuit board device according to this embodiment is constructed.

Holding block 108 is basically made of a metal material. Holding block 108 is provided with positioning throughholes 119a and 119b, as shown in FIG. 7. Fourth wiring board 104 is provided with positioning throughholes 116a and 116b, and electrode terminals 112 are provided on the front surface of fourth wiring board 104 for signal connection. First wiring board 101 is laminated on fourth wiring board 104 through functional block 106 which has anisotropically conductive member 105 fitted therein, and electrode terminals 112 correspond to electrode terminals 109b provided on the back surface of this first wiring board 101 for signal connection on a one-to-one basis.

Anisotropically conductive member 105 placed between fourth wiring board 104 and first wiring board 101 is basically made of an insulating elastic resin material. On top of that, anisotropically conductive member 105 is embedded with metal fine lines in a vertical direction with respect to the front and back surfaces of each wiring board at positions corresponding to electrode terminals 112 provided on the front surface of fourth wiring board 104 and electrode terminals 109b provided on the back surface of first wiring board 101.

Functional block 106 in turn is basically made of a metal material. Then, functional block 106 is provided with positioning throughholes 117a and 117b, and is also formed together with through window 120 as a frame-shaped opening in which anisotropically conductive member 105 is fitted. This through window 120 is formed larger than the outside shape of anisotropically conductive member 105 taking into consideration both the amount of expansion on a contact surface of each wiring board and a slight margin when anisotropically conductive member 105 is compressed. Then, anisotropically conductive member 105 is fitted into this through window 120. Also, since the thickness of anisotropically conductive member 105 is formed larger than the thickness of functional block 106, at least one of the front and back surfaces of anisotropically conductive member 105 which is fitted in through window 120 formed through functional block 106 is positioned outside of the front surface or back surface of functional block 106 when anisotropically conductive member 105 is not compressed.

First wiring board 101 is provided with positioning throughholes 113a and 113b. First wiring board 101 is provided with electrode terminals 109b for signal connection which correspond one-to-one to electrode terminals 112 of fourth wiring board 104 on the back surface thereof, and is provided with electrode terminals 109a for signal connection on the front surface thereof. Second wiring board 102 is laminated on first wiring board 101 through functional block 106 having anisotropically conductive member 105 fitted therein, where electrode terminals 109a correspond one-to-one to electrode terminals 110b provided on the back surface of this second wiring board 102 for signal connection.

Anisotropically conductive member 105 placed between first wiring board 101 and second wiring board 102 is basically made of an insulating elastic resin material. On top of that, anisotropically conductive member 105 is embedded with metal fine lines in a vertical direction with respect to the front and back surfaces of each wiring board at positions corresponding to electrode terminals 109a provided on the front surface of first wiring board 101 and electrode terminals 110b provided on the back surface of second wiring board 102.

Second wiring board 102 is provided with positioning throughholes 114a and 114b. Second wiring board 102 is provided with electrode terminals 110b for signal connection which correspond one-to-one to electrode terminals 109a of first wiring board 101 on the back surface thereof, and is provided with electrode terminals 110a for signal connection on the front surface thereof. Third wiring board 103 is laminated on second wiring board 102 through functional block 106 having anisotropically conductive member 105 fitted therein, where electrode terminals 110a correspond one-to-one to electrode terminals 111 provided on the back surface of this third wiring board 103 for signal connection.

Anisotropically conductive member 105 placed between second wiring board 102 and third wiring board 103 is basically made of an insulating elastic resin material. On top of that, anisotropically conductive member 105 is embedded with metal fine lines in a vertical direction with respect to the front and back surfaces of each wiring board at positions corresponding to electrode terminals 110a provided on the front surface of second wiring board 102 and electrode terminals 111 provided on the back surface of third wiring board 103.

Third wiring board 103 is provided with positioning throughholes 115a and 115b. Third wiring board 103 is provided with electrode terminals 111 for signal connection which correspond one-to-one to electrode terminals 110a of second wiring board 102 on the back surface thereof. Also, holding block 107 has a similar shape to holding block 108, is made basically of a metal material like holding block 108, and has positioning throughholes 118a and 118b.

Next, a description will be given of a wiring board connecting method for the circuit board device according to this embodiment. As shown in FIG. 7, positioning throughholes 119a and 119b provided through holding block 108 are fitted over positioning pins 121a and 121b provided on positioning jig 122. Then, positioning throughholes 116a and 116b provided through fourth wiring board 104 are fitted over positioning pins 121a and 121b from above them. Then, positioning throughholes 117a and 117b provided through functional block 106 are fitted over positioning pins 121a and 121b further from above them.

Anisotropically conductive member 105 is fitted in through window 120 of functional block 106. Through window 120 is formed larger than the outside shape of anisotropically conductive member 105 taking into consideration both the amount of expansion on a contact surface of each wiring board and a slight margin when anisotropically conductive member 105 is compressed. In this way, when anisotropically conductive member 105 is compressed, anisotropically conductive member 105 expands within through window 120 so as to increase the area of the contact surface with each wiring board. In this way, it is possible to prevent the impact resilient force that is exerted by anisotropically conductive member 105 in a compression direction from excessively increasing. Also, this anisotropically conductive member 105 is embedded with metal fine lines in a vertical direction with respect to the front and back surfaces of each wiring board at positions corresponding to electrode terminals 112 provided on the front surface of fourth wiring board 104 and electrode terminals 109b provided on the back surface of first wiring board 101.

Positioning throughholes 113a and 113b provided through first wiring board 101 are further fitted over positioning pins 121a and 121b from above functional block 106. In this way, functional block 106 which has anisotropically conductive member 105 that is fitted into window 120 is sandwiched between fourth wiring board 104 and first wiring board 101. In this event, positioning throughholes 119a and 119b provided through holding block 108, positioning throughholes 116a and 116b provided through fourth wiring board 104, positioning throughholes 117a and 117b provided through functional block 106, and positioning throughholes 113a and 113b provided through first wiring board 101 are fitted over and accurately positioned by positioning pins 121a and 121b provided on positioning jig 122, respectively.

Likewise, positioning throughholes 117a and 117b provided through functional block 106 are fitted over positioning pins 121a and 121b from above first wiring board 101. Anisotropically conductive member 105 is fitted in through window 120 of this functional block 106. Through window 120 is formed larger than the outside shape of anisotropically conductive member 105 taking into consideration both the amount of expansion on a contact surface of each wiring board and a slight margin when anisotropically conductive member 105 is compressed. In this way, when anisotropically conductive member 105 is compressed, anisotropically conductive member 105 expands within through window 120 so as to increase the area of a contact surface with each wiring board. In this way, it is possible to prevent an impact resilient force that is exerted by anisotropically conductive member 105 in a compression direction from excessively increasing. This anisotropically conductive member 105 is embedded with metal fine lines in a vertical direction with respect to the front and back surfaces of each wiring board at positions corresponding to electrode terminals 109a provided on the front surface of first wiring board 101 and electrode terminals 110b provided on the back surface of second wiring board 102.

Positioning throughholes 114a and 114b provided through second wiring board 102 are further fitted over positioning pins 121a and 121b from above functional block 106. In this way, functional block 106 which has anisotropically conductive member 105 fitted in through window 120 is sandwiched between first wiring board 101 and second wiring board 102. In this event, positioning throughholes 119a and 119b provided through holding block 108, positioning throughholes 116a and 116b provided through fourth wiring board 104, positioning throughholes 117a and 117b provided through functional block 106, positioning throughholes 113a and 113b provided through first wiring board 101, positioning throughholes 117a and 117b provided through functional block 106, and positioning throughholes 114a and 114b provided through second wiring board 102 are fitted through positioning pins 121a and 121b provided on positioning jig 122, and are accurately positioned by positioning pins 121a and 121b, respectively.

Likewise, positioning throughholes 117a and 117b provided through functional block 106 are fitted over positioning pins 121a and 121b from above second wiring board 102. Anisotropically conductive member 105 is fitted in through window 120 of this functional block 106. Through window 120 is formed larger than the outside shape of anisotropically conductive member 105 taking into consideration both the amount of expansion on a contact surface of each wiring board and a slight margin when anisotropically conductive member 105 is compressed. In this way, when anisotropically conductive member 105 expand within through window 120 so as to increase the area of a contact surface with each wiring board. In this way, it is possible to prevent the impact resilient force that is exerted by anisotropically conductive member 105 in a compression direction from excessively increasing. This anisotropically conductive member 105 is embedded with metal fine lines in a vertical direction with respect to the front and back surfaces of each wiring board at positions corresponding to electrode terminals 110a provided on the front surface of second wiring board 102 and electrode terminals 111 provided on the back surface of third wiring board 103.

Further, positioning throughholes 115a and 115b provided through third wiring board 103 are fitted through positioning pins 121a and 121b from above functional block 106. In this way, functional block 106 which has anisotropically conductive member 105 fitted in through window 120 is sandwiched between second wiring board 102 and third wiring board 103. Further from above, positioning throughholes 118a and 118b provided through holder bock 107 are fitted over positioning pins 121a and 121b.

In this event, positioning throughholes 119a and 119b provided through holding block 108, positioning throughholes 116a and 116b provided through fourth wiring board 104, positioning throughholes 117a and 117b provided through functional block 106, positioning throughholes 113a and 113b provided through first wiring board 101, positioning throughholes 117a and 117b provided through functional block 106, positioning throughholes 114a and 114b provided through second wiring board 102, positioning throughholes 117a and 117b provided through functional block 106, positioning throughholes 115a and 115b provided through third wiring board 103, and positioning throughholes 118a and 118b provided through holder bock 107 are fitted through positioning pins 121a and 121b provided on positioning jig 122, and are accurately positioned by positioning pins 121a and 121b, respectively.

In this state, pressure is added between holding block 107 and holding block 108 by a clamp jig (not shown) or the like to compress anisotropically conductive member 105 placed between the respective wiring boards to the thickness of functional block 106, and this state is held. In this way, electrode terminals 112 provided on the front surface of fourth wiring board 104 for signal connection are electrically connected to electrode terminals 109b provided on the back surface of first wiring board 101 for signal connection through the conductor area of anisotropically conductive member 105; electrode terminals 109a provided on the front surface of first wiring board 101 for signal connection are electrically connected to electrode terminals 110b provided on the back surface of second wiring board 102 for signal connection through the conductor area of anisotropically conductive member 105; and electrode terminals 110a provided on the front surface of second wiring board 102 for signal connection are electrically connected to electrode terminals 111 provided on the back surface of third wiring board 103 for signal connection through the conductor area of anisotropically conductive member 105.

Here, in the circuit board device according to this embodiment, even when the circuit board device is applied with an impulse-like external force such as a drop impact force, not to mention the case where it is applied with a static external force, each dimension can be calculated and determined such that composite inherent period T of functional block 106, holding block 107 and holding block 108 is equal to or less than an instantaneous signal break restraint time, in order to prevent instantaneous signal breaks.

As shown in FIG. 8, assume that $W_1$ represents the width of anisotropically conductive member 105 in the longitudinal direction; $L_1$ the width in the latitudinal direction, and $H_1$ the width in the thickness direction. Also, as shown in FIG. 9, assume that $W_2$ represents the width of functional block 106 in the longitudinal direction, $L_2$ the width in the latitudinal direction, and $H_2$ the width in the thickness direction; $W_{21}$ the width of through window 120 in the longitudinal direction and $L_{21}$ the width in the latitudinal direction; and $W_{22}$ represents the distance from one end of functional block 106 to through window 120 in the longitudinal direction. Also, as shown in FIG. 10, $W_3$ represents the width of holding block 107 in the longitudinal direction, $L_3$ the width in the latitudinal direction, and $H_3$ the width in the thickness direction. Also, as mentioned above, holding block 108 has a shape similar to holding block 107.

For example, in order to prevent a signal break for 1 μsec or longer in the circuit board device according to this embodiment, composite inherent period T of functional block 106, holding block 107 and holding block 108 may be calculated by the following Equation 1 such that it is equal to or less than 1 μsec, and dimensions of each part may be determined. Here, λ is a first-order solution for a characteristic equation of a cantilever, where λ=1.8751, E and ρ are the Young's modulus and density of the material of functional block 106, I is a second moment of area at distance $W_{22}$ from one end of functional block 106 to through window 120 in the longitudinal direction, where $I=W_{22} \times H_2/12$, and A is a sum total of cross-sectional areas, where $A=W_{22} \times H$, $H=3 \times H_2 + 2 \times H_3$.

$$T = \frac{2\pi}{\left(\frac{\lambda}{L_2/2}\right)^2 \cdot \left(\frac{EI}{\rho A}\right)^{\frac{1}{2}}} \quad \text{[Equation 1]}$$

Next, a description will be given of the operation of the circuit board device according to this embodiment, which is configured as described above. In the circuit board device according to this embodiment, functional blocks 106 having anisotropically conductive member 105 that is fitted therein are placed and laminated between wiring boards. From this fact, even if a static external force or the like is applied, functional blocks 106 restrain the wiring boards from deforming and restrain fluctuations in the impact resilient force of anisotropically conductive member 105, so that the wiring boards are electrically interconnected with high stability.

Also, through window 120 of functional block 106 is formed larger than the outside shape of anisotropically conductive member 105 taking into consideration both the amount of expansion δ on a contact surface of each wiring board and a slight margin when anisotropically conductive member 105 is compressed. From this fact, when anisotropically conductive member 105 is compressed by keeping holding blocks 107 and 108 compressed, it is possible to prevent the impact resilient force from being excessively applied in the compression direction by anisotropically conductive member 105.

Also, anisotropically conductive member 105 is fitted in through window 120 provided through functional block 106. Thus, even if the ambient temperature changes, functional block 106 surrounding anisotropically conductive member 105 restrains a linear expansion of anisotropically conductive member 105, thus making it possible to provide stable electric connections between the wiring boards without causing a large shift between the wiring boards and the anisotropically conductive members.

Also, composite inherent period T of functional block 106, holding block 107 and holding block 108 is calculated and configured to be equal to or less than 1 μsec. Accordingly, no signal break for 1 μsec or longer will occur even if an impulse-like external force such as drop impact force is applied, as well as the case where a static external force is applied.

While the circuit board device according to this embodiment is an example which has four laminated wiring boards, this is not a limitation, but an arbitrary number of wiring boards can be selectively laminated. With anisotropically conductive member 105 fitted in through window 120 of functional block 106, functional block 106 controls the compression ratio of anisotropically conductive member 105 within an optimal range, so that even if an laminated number of wiring boards are increased, unevenness of the impact resilient force of each anisotropically conductive member 105 is restrained. Accordingly, it is possible to provide a circuit board device which demonstrates a highly stable electric connection between the wiring boards.

Further, anisotropically conductive member 105 is not limited to a member made basically of an insulating elastic resin material and embedded with metal thin lines, but may be a member in which metal particles, gold plated particles or copper plated particles can be used instead of metal thin lines. Also, while functional block 106 and holding blocks 107 and 108 are made basically of metal materials, they are not so limited, but blocks made basically of a resin material or a ceramic material may be used. However, it should be understood that the dimensions of each part of functional block 106 and holding blocks 107 and 108 must be optimized such that their composite inherent period T is equal to or less than an instantaneous signal break restraining time in accordance with aforementioned Equation 1. Also, while functional block 106 is in the shape of frame, it does not have to be exactly a rectangular frame shape. Through window 120 is provided as an opening for fitting anisotropically conductive member 105 therein, so that any shape may be chosen as long as functional block 106 surrounding anisotropically conductive member 105 restrains the linear expansion of anisotropically conductive member 105, even if the ambient temperature changes, by fitting anisotropically conductive member 105 in this through window 120.

The positioning of the wiring boards relative to each other, the positioning of the wiring boards and holding blocks, and the positioning of each wiring board and functional block 106 are not limited to the method of fitting the positioning throughholes formed through each wiring board, functional block 106, and each holding block over positioning pins 121a and 121b provided on positioning jig 122. Such positioning can also be achieved by forming alignment marks on each wiring board, functional block 106, and each holding block, and observing the alignment marks by a CCD (Charge Coupled Devices) camera.

Figure 11A:
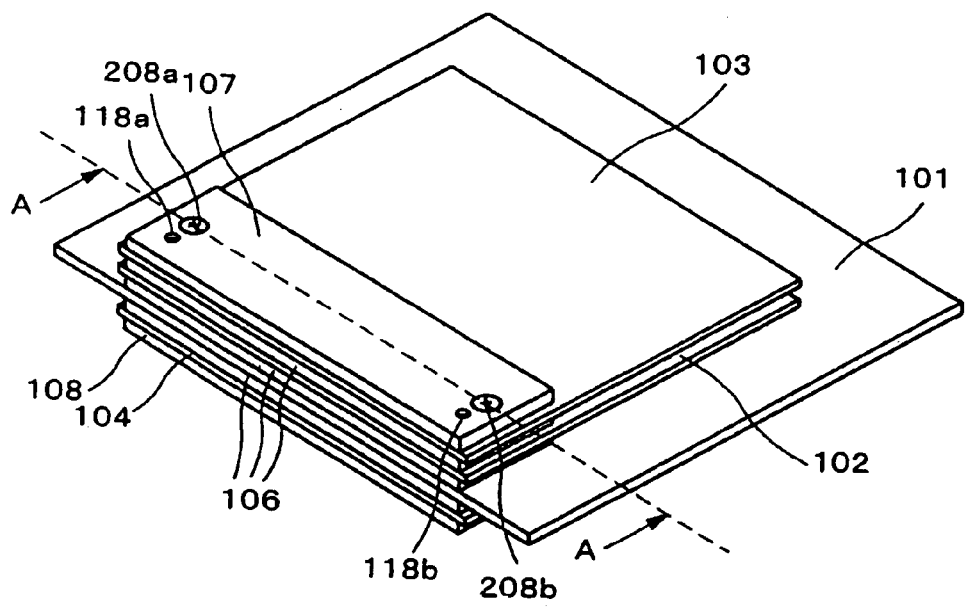
FIG. 11a
A schematic perspective view showing a circuit board device according to a second embodiment of the present invention.
Figure 11B:
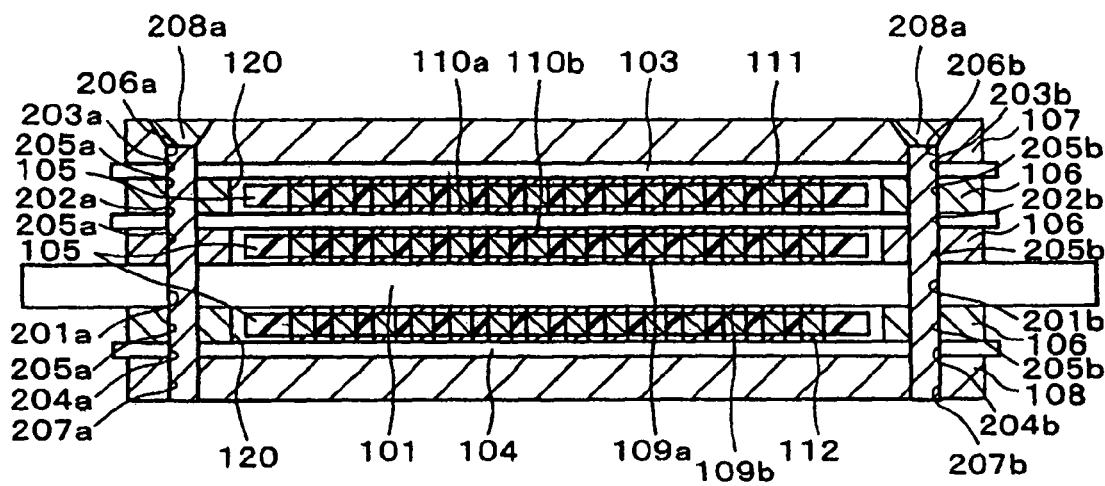
Figure 12:
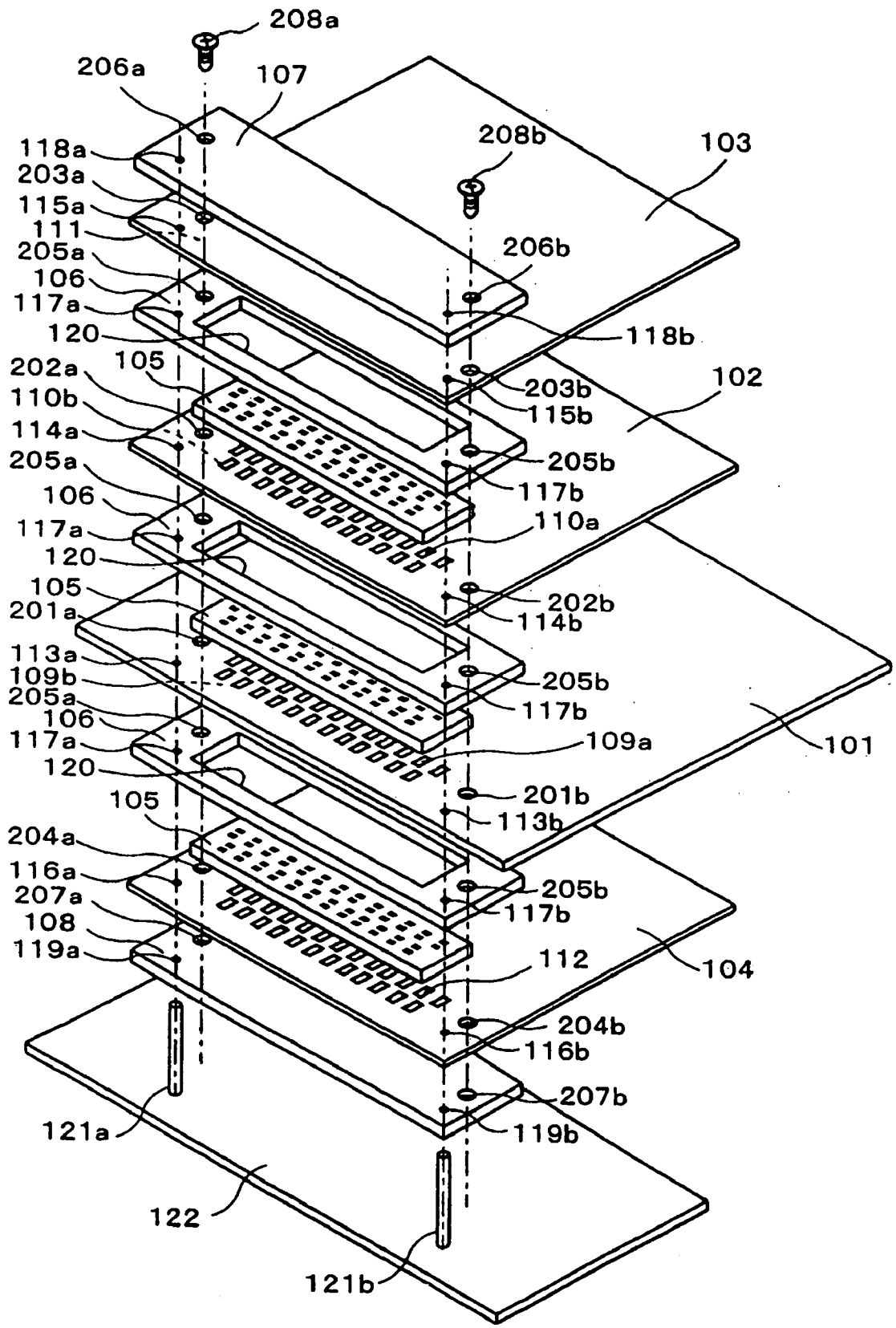
FIG. 12
An exploded perspective view showing the configuration of the circuit board device and a wiring board connecting method according to the second embodiment of the present invention.
Figure 13:
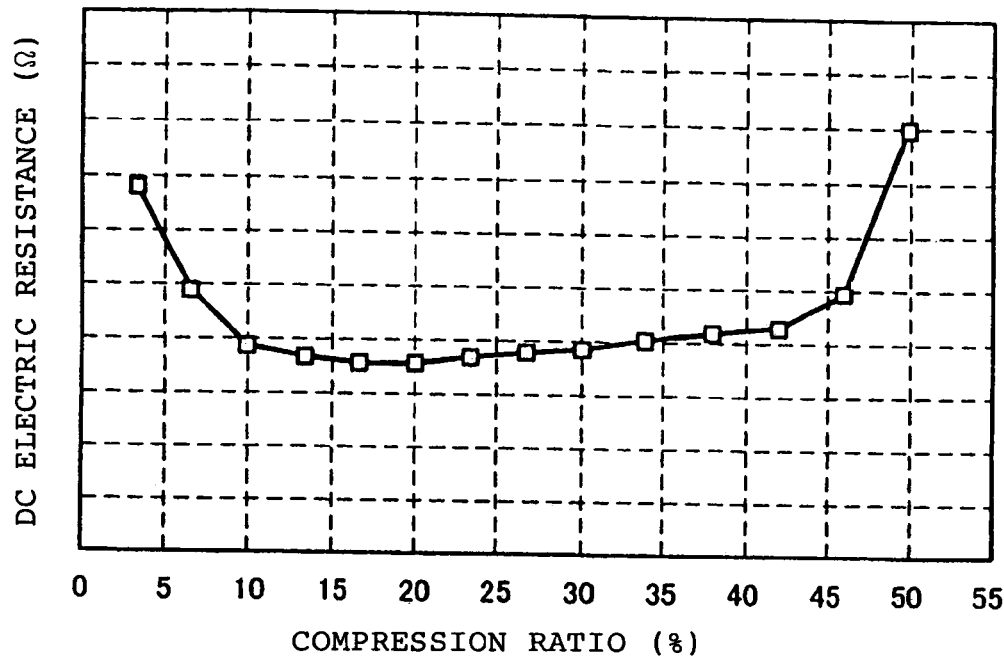
FIG. 13
A graph showing the relationship between the compression ratio and DC electric resistance of anisotropically conductive member 105 of the circuit board device according to the second embodiment of the present invention.

Next, a second embodiment of the present invention will be described. FIG. 11a is a schematic perspective view showing a circuit board device according to this embodiment; FIG. 11b is a cross-sectional view along line A-A in FIG. 11a; FIG. 12 is an exploded perspective view showing the configuration of the circuit board device and a wiring board connecting method according to this embodiment, and FIG. 13 is a graph showing the relationship between a compression ratio and a DC electric resistance of anisotropically conductive member 105 of the circuit board device according to this embodiment of the present invention. In FIGS. 11 through 13, the same components to those in FIGS. 6 through 10 are designated the same reference numerals, and detailed descriptions thereon are omitted.

In the first embodiment described above, the circuit board device is applied with a pressure by a clamp jig (not shown) or the like, whereby anisotropically conductive member 105 sandwiched between the respective wiring boards is compressed to the thickness of functional block 106, and this state is maintained. On the other hand, in this embodiment, the circuit board device is applied with pressure by screws 208a and 208b instead of the clamp jig (not shown) or the like. The rest is similar in structure to the first embodiment.

As shown in FIGS. 11a, 11b, the circuit board device according to this embodiment comprises fourth wiring board 104 provided with electrode terminals 112 on a front surface thereof, first wiring board 101 provided with electrode terminals 109b on a back surface and electrode terminal 109a on a front surface, a second wiring board 102 provided with electrode terminal 110b on a back surface and electrode terminals 110a on a front surface, and a third wiring board 103 provided with electrode terminals 111 on a back surface, which are laminated between holding block 108 and holding block 107, with the intervention of functional blocks 106 having anisotropically conductive member 105 fitted therein between the respective wiring boards. Then, fourth wiring board 104 is provided with screw escape throughholes 204a and 204b at both longitudinal ends thereof; functional block 106 is provided with screw escape throughholes 205a and 205b at both longitudinal ends thereof; first wiring board 101 is provided with screw escape throughholes 201a and 201b at both longitudinal ends thereof; second wiring board 102 is provided with screw escape throughholes 202a and 202b at both longitudinal ends thereof; third wiring board 103 is provided with screw escape throughholes 203a and 203b at both longitudinal ends thereof; and holding block 107 is provided with screw escape throughhole 206a and 206b at both longitudinal ends thereof, respectively.

Screw 208a passes through screw escape throughholes 203a, 205a, 202a, 205a, 201a, 205a and 204a from screw escape throughhole 206a formed through holding block 107, and is joined into screw joining tap hole 207a formed at both longitudinal ends of holding block 108. Also, similarly, screw 208b passes through screw escape throughholes 203b, 205b, 202b, 205b, 201b, 205b and 204b from screw escape throughhole 206b formed through holding block 107, and is joined into screw joining tap hole 207b formed at both longitudinal ends of holding block 107.

By joining screws 208a and 208b into screw joining tap holes 207a and 207b formed in holding block 108, a pressure is added and maintained to compress anisotropically conductive member 105 sandwiched between the respective wiring boards to the thickness of functional block 106. In this way, the circuit board device according to this embodiment is constructed. The configuration other than the foregoing in this embodiment is similar to the first embodiment described above.

Next, a description will be given of a wiring board connecting method for the circuit board device according to this embodiment. As shown in FIG. 12, positioning throughholes 119a and 119b provided through holding block 108 are fitted over positioning pins 121a and 121b provided on positioning jig 122. Then, in a manner similar to the first embodiment described above, holding block 108, fourth wiring board 104, functional block 106 having anisotropically conductive member 105 fitted in through window 120, first wiring board 101, functional block 106 having anisotropically conductive member 105 fitted in through window 120, second wiring board 102, functional block 106 having anisotropically conductive member 105 fitted in through window 120, third wiring board 103, and holding block 107 are laminated, respectively, in a state where they are accurately positioned. In this state, screw 208a is inserted through screw escape throughholes 203a, 205a, 202a, 205a, 201a, 205a and 204a from screw escape throughhole 206a provided through holding block 107, and joined into screw joining tap hole 207a formed at one longitudinal end of holding block 107. Also, in a similar manner, screw 208b is inserted through screw escape throughholes 203b, 205b, 202b, 205b, 201b, 205b and 204b from screw escape throughhole 206b provided through holding block 107, and joined into screw joining tap hole 207b formed at the other longitudinal end of holding block 107.

In this way, electrode terminals 112 provided on the front surface of fourth wiring board 104 for signal connection are electrically connected to electrode terminals 109b provided on the back surface of first wiring board 101 for signal connection through the conductive area of anisotropically conductive member 105; electrode terminals 109a provided on the front surface of first wiring board 101 for signal connection are electrically connected to electrode terminals 110b provided on the back surface of second wiring board 102 for signal connection through the conductive area of anisotropically conductive member 105; electrode terminals 110a provided on the front surface of second wiring board 102 for signal connection are electrically connected to electrode terminals 111 provided on the back surface of third wiring board 103 for signal connection through the conductive area of anisotropically conductive member 105. In this way, the circuit board device according to this embodiment is formed.

Anisotropically conductive member 105 is made basically of an insulating elastic resin material, and an anisotropically conductive member embedded with metal thin lines can be used therefor. For example, silicone rubber with a rubber hardness of 50 degrees (JIS-K-6249) can be used as the insulating elastic resin material. Also, the metal thin lines are embedded in a vertical direction with respect to the front and back surfaces of each wiring board at positions corresponding to electrode terminals 112 provided on fourth wiring board 104, electrode terminals 109b provided on the back surface of first wiring board 101, electrode terminal 109a provided on the front surface of first wiring board 101, electrode terminals 110b provided on the back surface of second wiring board 102, electrode terminals 110a provided on the front surface of second wiring board 102, and electrode terminals 111 provided on the back surface of third wiring board 103, respectively. For example, a conductive material made of Au-plated stainless wire having a diameter of $\phi$ 12 μm can be used for the metal thin lines, where $W_1$=4.2 mm, $L_1$=1.2 mm, and $H_1$=0.3 mm can be chosen.

FIG. 13 shows the resistance of anisotropically conductive member 105 when thickness $H_1$ of anisotropically conductive member 105 of the circuit board device according to this embodiment is compressed to thickness $H_2$ of functional block 106. From FIG. 13, anisotropically conductive member 105 has a stable electric resistance when the compression ratio is in a range of 10 to 45%. Accordingly, $H_2$=0.25 mm, for example, can be chosen (compression ratio is 16.7%).

Also, the volume of an insulating elastic resin material, which is the base material of anisotropically conductive member 105, does not characteristically change even after compression. Thus, calculating the amount of expansion δ on a contact surface with a wiring board by the following Equation 2, which represents the relationship before and after the compression of the insulating elastic resin material, δ=0.180625 mm is derived. From this fact, $W_{21}$=$W_1$+0.2 mm=4.4 mm, $L_{21}$=$L_1$+0.2 mm=1.4 mm, and $W_2$=7.4 mm can be chosen taking into consideration this amount of expansion δ and a slight margin.

$$\delta = -(W_1 + L_1) + \frac{\sqrt{(W_1 + L_1)^2 - 4 \cdot \left(W_1 \cdot L_1 - W_1 \cdot L_1 \cdot \frac{H_1}{H_2}\right)}}{2}$$ [Equation 2]

For functional block 106, stainless steel, for example, can be used as the metal material. In regard to $L_2$ shown in FIG. 9, in order to prevent an instantaneous signal break (in here, a signal break for 1 μsec or longer) when an impulse-like external force such as drop impact force is applied, as well as the case where a static external force is applied, composite inherent period T of functional block 106, holding block 107 and holding block 108 can be calculated by the aforementioned Equation 1 such that it is equal to or less than 1 μsec, and $L_2$=2.3 mm can be derived. Here, E and ρ are the Young's modulus and density of stainless steel, where E=197 GPa, and ρ=8000 kg/m³, I is a second moment of area at distance $W_{22}$ from one end of functional block 106 to through window 120 in the longitudinal direction, where I=$W_{22}$×$H_2^3$/12, and A is a sum total of cross-sectional areas, where A=$W_{22}$×H, H=3×$H_2$+2×$H_3$.

Holding blocks 107 and 108 are blocks which have the same shape and are basically made of a metal material. Then, holding block 107 is provided with positioning throughholes 118a and 118b and with screw escape throughholes 206a and 206b, while holding block 108 is provided with positioning throughholes 119a and 119b and with screw joining tap holes 207a and 207b, respectively.

For holding blocks 107 and 108, stainless steel can be used by way of example. Then, each dimension shown in FIG. 10 can be $W_3$=7.4 mm and $L_3$=2.3 mm such that they are the same dimensions as those of functional block 106. Also, thickness $H_3$ of the holding block can be $H_3$=0.5 mm by optimizing width $L_2$ of functional block 106 in accordance with the aforementioned Equation 1 when it is calculated.

For example, a rigid printed wiring board basically made of FR4 can be used as first wiring board 101; a flexible printed wiring board basically made of polyimide can be used as second wiring board 102; a flexible printed wiring board basically made of polyimide can be used as third wiring board 103; and a flexible printed wiring board basically made of polyimide can be used as fourth wiring board 104.

Also, for example, electrode terminals 109a provided on the front surface of first wiring board 101 and electrode terminals 109b provided on the back surface of the same; electrode terminals 110a provided on the front surface of second wiring board 102 and electrode terminals 110b provided on the back surface of the same; electrode terminals 111 provided on the back surface of third wiring board 103; and electrode terminals 112 provided on the front surface of fourth wiring board 104 can be formed with the number of terminals equal to 25, a longitudinal pitch equal to 0.3 mm (L/S=0.15/0.15), a latitudinal pitch equal to 0.8 mm, and terminal dimensions equal to 0.15 (W)×0.5 (L) mm. Then, the respective terminals can be set in a staggered arrangement (12 terminals closer to the end of the board, and 13 terminals on the other side).

Next, a description will be given of the operation of the circuit board device according to this embodiment, configured as described above. In the first embodiment described above, the circuit board device is applied with pressure by a clamp jig (not shown) or the like, whereby anisotropically conductive member 105 sandwiched between the respective wiring boards is compressed to the thickness of functional block 106, and this state is maintained. On the other hand, in this embodiment, the circuit board device is applied with pressure by screws instead of by the clamp jig or the like to maintain the anisotropically conductive member in the compressed state. For this reason, in addition to operations and actions similar to the circuit board device according to the first embodiment described above, the circuit board device of this embodiment further excels as regards the stability of connections of the conductive patterns on the wiring boards with each other, even if an increased number of wiring boards are laminated, and can further reduce the thickness and volume as well.

While the circuit board device according to this embodiment uses a rigid printed wiring board basically made of FR4 for first wiring board 101, and flexible printed wiring boards basically made of polyimide for second wiring board 102, third wiring board 103, and fourth wiring board 104, the circuit board device is not so limited. Rigid printed wiring boards and flexible printed wiring boards can be arbitrarily combined. Also, the number of laminated wiring boards is not limited to four, but an arbitrary number of lamination can be selected.

Further, this embodiment has shown an example in which anisotropically conductive member 105 is basically made of insulating elastic resin material embedded with metal thin lines, and a conductive material made of Au-plated stainless wire having a diameter of φ 12 μm is used for the metal fine lines. However, metal thin lines are not so limited, one either of gold lines, copper lines, brass lines, phosphor bronze lines, or nickel lines can be used, and their diameter may be in a range of φ 5 m to φ 20 μm. Also, the insulating elastic resin material, which is the base material, is not limited to be embedded with metal thin lines, but the base material which is embedded with one either of gold particles, gold-plated particles, or copper-plated particles may be used instead of the metal thin lines. Also, while an example has been shown, where silicone rubber with a rubber hardness of 50 degrees (JIS-K-6249) is used for the insulating elastic resin material, the rubber hardness may fall within a range of 20 to 80 degrees.

Further, in this embodiment, functional block 106 is basically made of a metal material, but is not so limited, and a resin material or a ceramic material can be used as well. Also, while thickness $H_2$ of functional block 106 is chosen to be 0.25 mm, it is not so limited. Thickness $H_2$ can be arbitrarily set as long as it can ensure a compression amount of 10 to 45% which can result in a stable electric resistance of anisotropically conductive member 105.

Also, while holding blocks 107 and 108 are basically made of a metal material, they are not so limited, but a resin material or a ceramic material can be used as well. Also, while the thickness $H_3$ of the holding blocks is chosen to be 0.5 mm, it is not so limited. Thickness $H_3$ can be arbitrarily set as long as it can ensure a compression amount of 10 to 45% which can result in anisotropically conductive member 105 having a stable electric resistance. However, it should be understood that the dimensions of each part of functional block 106 and holding blocks 107 and 108 must be optimized such that their composite inherent period T is equal to or less than 1 μsec in accordance with the aforementioned Equations 1 and 2.

The positioning of the wiring boards relative to each other, the positioning of the wiring boards and holding blocks, and the positioning of each wiring board and functional block 106 are not limited to the method of fitting the positioning throughholes, formed through each wiring board, functional block 106, and each holding block over positioning pins 121a and 121b provided on positioning jig 122. Such positioning can be also achieved by forming alignment marks on each wiring board, functional block 106, and on each holding block, and observing the alignment marks by a CCD (Charge Coupled Devices) camera.

Figure 14:
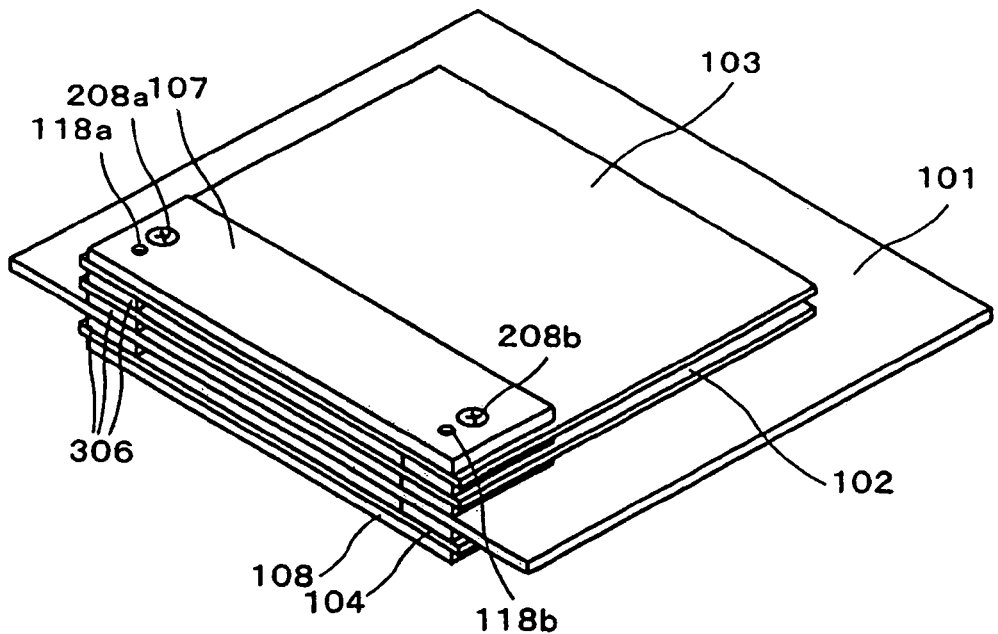
FIG. 14
A schematic perspective view showing a circuit board device according to a third embodiment of the present invention.
Figure 15:
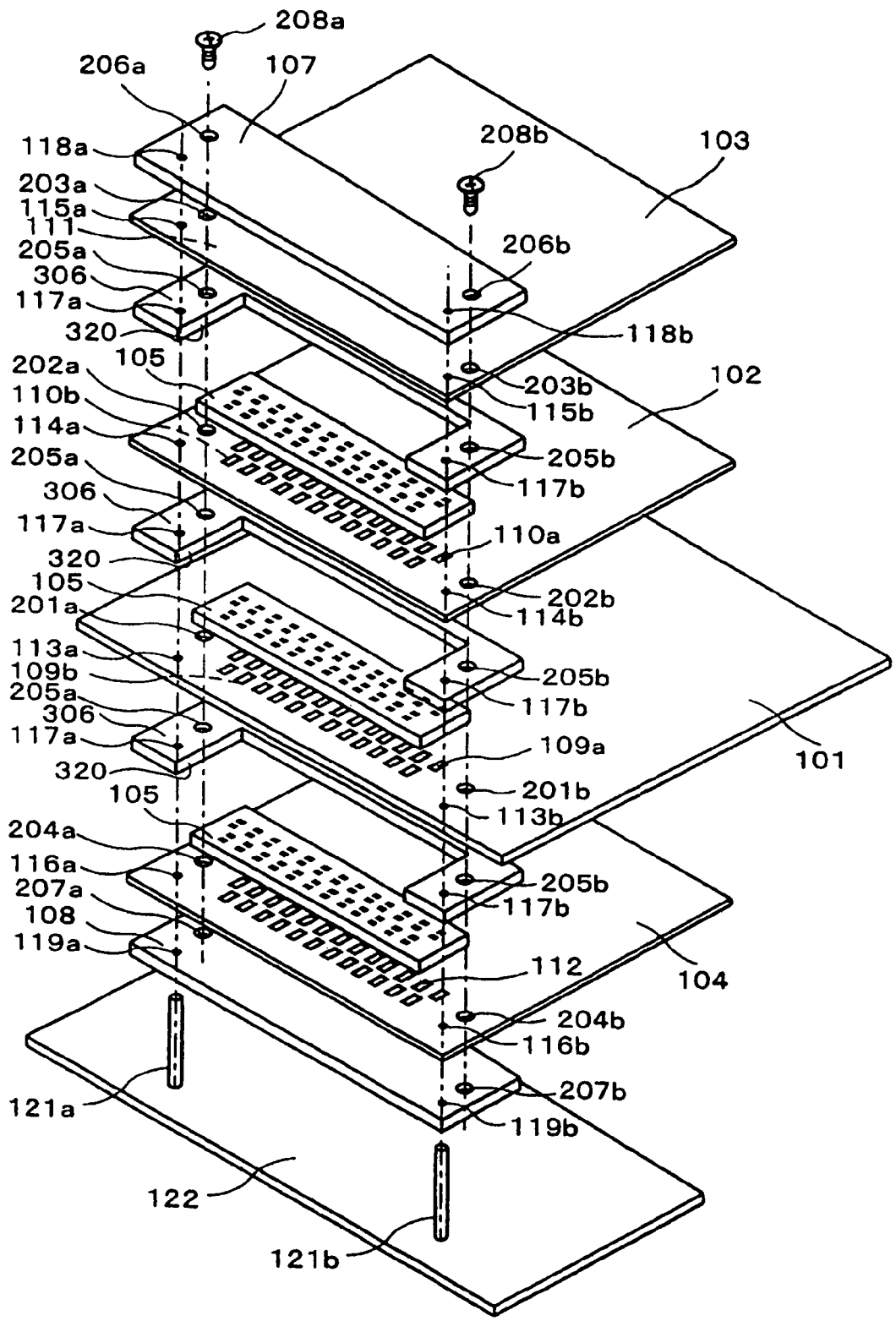
FIG. 15
An exploded perspective view showing the configuration of the circuit board device and a wiring board connecting method according to the third embodiment of the present invention.
Figure 16:
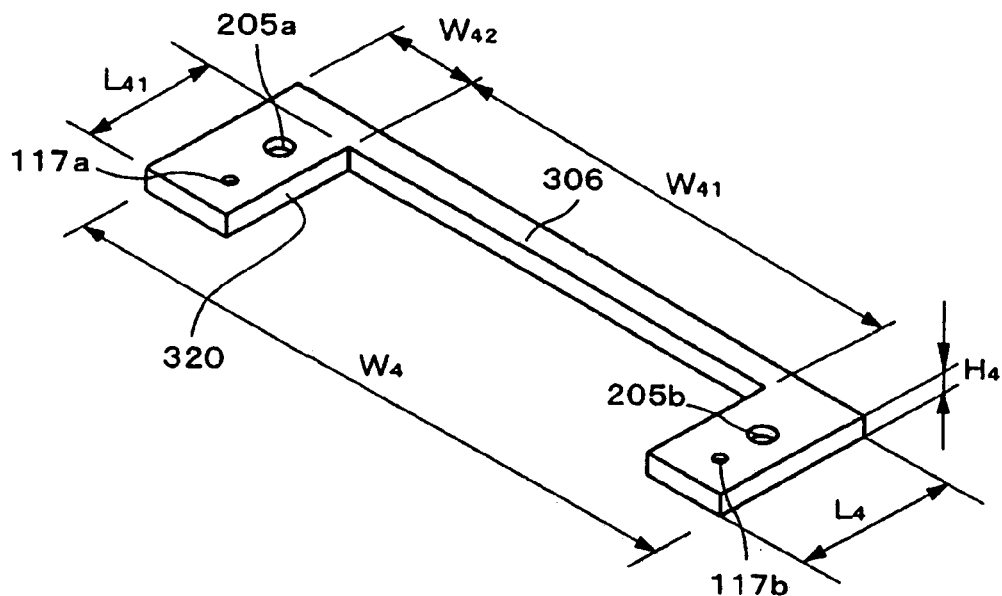
FIG. 16
A schematic perspective view showing functional block 306 of the circuit board device according to the third embodiment of the present invention.

Next, a third embodiment of the present invention will be described. FIG. 14 is a schematic perspective view showing a circuit board device according to this embodiment; FIG. 15 is an exploded perspective view showing the configuration of the circuit board device and a wiring board connecting method according to this embodiment, and FIG. 16 is a schematic perspective view showing functional block 306 of the circuit board device according to this embodiment. In FIGS. 14 through 16, the same components to those in FIGS. 6 through 13 are designated the same reference numerals, and detailed descriptions thereon are omitted.

In the second embodiment described above, functional block 106 is in the shape of a frame which comprises through window 120 as an opening in which anisotropically conductive member 105 is fitted, and anisotropically conductive member 105 is fitted in this through window 120. On the other hand, in this embodiment, functional block 306 is in a U-shape which comprises cutout 320 so as to surround three sides of anisotropically conductive member 105, as shown in FIGS. 14 through 16, where the three sides of anisotropically conductive member 105 are surrounded by this cutout 320. The rest is similar in structure to the second embodiment.

Functional block 306 is basically made of a metal material, and comprises cutout 320, thereby resulting in a U-shape which surrounds three sides of anisotropically conductive member 105. Functional block 306 is provided with positioning throughholes 117a and 117b and with screw escape throughholes 205a and 205b. Then, the three sides of anisotropically conductive member 105 are surrounded by functional block 306, and one longitudinal side of anisotropically conductive member 105 is opened in an opening of functional block 306. In this way, when anisotropically conductive member 105 is compressed, anisotropically conductive member 105 expands in this opening so as to increase the area of a contact surface with a wiring board, making it possible to prevent an impact resilient force from being excessively applied in the compression direction by anisotropically conductive member 105.

Similar to the second embodiment described above, thickness $H_4$ of functional block 306 can be chosen to be $H_4$=0.25 mm, i.e, the compression ratio is 16.7%, in order to ensure a compression amount in a range of 10 to 45% which can result in a stable electric resistance, based on the relationship between the compression ratio and the DC electric resistance of anisotropically conductive member 105 shown in FIG. 13.

Also, the volume of insulating elastic resin material, which is the base material of anisotropically conductive member 105, does not characteristically change even after compression. In this embodiment, taking into consideration the fact that one longitudinal side of anisotropically conductive member 105 is completely opened, the amount of expansion δ on a contact surface with a wiring board toward the opened side is calculated by the following Equation 3 which represents the relationship before and after compression of the insulating elastic resin material, thereby δ=0.24 mm is derived. From this fact, $W_{41}=W_1+0.2$ mm=4.2 mm, $L_{41}=L_1+0.3$ mm=1.5 mm, and $W_4$=7.2 mm can be chosen taking into consideration this amount of expansion δ and a slight margin.

$$\delta = L_1 \cdot \left(\frac{H_1}{H_4} - 1\right) \quad \text{[Equation 3]}$$

For functional block 306, stainless steel, for example, can be used as the metal material. In regard to $L_4$ shown in FIG. 16, in order to prevent an instantaneous signal break (in here, a signal break for 1 μsec or longer) when an impulse-like external force such as drop impact force is applied, as well as the case where a static external force is applied, composite inherent period T of functional block 306, holding block 107 and holding block 108 can be calculated by the following Equation 4 such that it is equal to or less than 1 μsec, and $L_4=2.3$ mm can be derived. Here, λ is a first-order solution for a characteristic equation of a cantilever, where $\lambda=1.8751$, E and ρ are the Young's modulus and density of stainless steel, where E=197 GPa, and ρ=8000 kg/m³, I is a second moment of area at distance $W_{42}$ from one end of functional block 306 to cutout 320 in the longitudinal direction, where $I=W_{42}\times H_4^3/12$, and A is a sum total of cross-sectional areas, where $A=W_{42}\times H$, $H=3\times H_4+2\times H_3$.

$$T = \frac{2\pi}{\left(\frac{\lambda}{L_4/2}\right)^2 \cdot \left(\frac{EI}{\rho A}\right)^{\frac{1}{2}}}$$ [Equation 4]

Here, it should be understood that thickness $H_3$ of holding blocks 107 and 108 is optimized by the foregoing Equation 4 when $L_4$ of functional block 306 is calculated.

Next, a description will be given of the operation of the circuit board device according to this embodiment, configured as described above. In the circuit board device according to this embodiment, functional block 306 is in contact with three sides of anisotropically conductive member 105, and the remaining one side of anisotropically conductive member 105 is opened in the opening. From this fact, when anisotropically conductive member 105 is compressed by keeping holding blocks 107 and 108 compressed, it is possible to prevent the impact resilient force from being excessively applied in the compression direction by anisotropically conductive member 105. Also, since the three sides of anisotropically conductive member 105 are surrounded by functional block 306, even if the ambient temperature changes, functional block 306 surrounding the three sides of anisotropically conductive member 105 restrains the linear expansion of anisotropically conductive member 105. It is therefore possible to provide stable electric connections between the wiring boards without causing a large shift between the wiring boards and the anisotropically conductive members 105. Also, since anisotropically conductive member 105 is used as an electrical connector between the respective wiring boards, and since functional block 306 is placed on the same plane as anisotropically conductive member 105, and since member 105 and block 306 are sandwiched and held compressed by these holding blocks 107 and 108, functional block 306 restrains deformations of each wiring board and fluctuations in the impact resilient forces of anisotropically conductive members 105 placed between the wiring boards when a static external force is applied to the circuit board device. Consequently, it is possible to realize a circuit board device which has stable DC electric resistance.

Also, when the circuit board device is deformed by an impulse-like external force such as a drop impact force applied thereto, composite inherent period T of functional block 306, holding block 107 and holding block 108 is calculated and set to be equal to or less than an instantaneous signal break restraint time (one μsec or less in this embodiment), so that the impact resilient force of anisotropically conductive member 105 will not fluctuate within the signal break restraint time. Consequently, it is possible to realize a circuit board device which has stable DC electric resistance.

Further, in this circuit board device, the compression ratio of anisotropically conductive member 105 is controlled within an optimal range by functional block 306. Thus, even if an increased number of wiring boards are laminated, it is impossible to restrain variations in the impact resilient force of each anisotropically conductive member 105 and to realize a circuit board device which has stable DC electric resistance with the aid of the effects of restraining the deformations of the wiring boards and restraining the linear expansion of anisotropically conductive member 105 by functional block 306.

In this embodiment, in addition to the operations and actions of the second embodiment described above, with the formation of cutout 320, rather than through window 120, in functional block 306, when the ambient temperature changes, the expansion due to the temperature change of anisotropically conductive member 105 can be restrained in a direction in which this expansion is the largest, so that the DC electric resistance further excels in stability.

While this embodiment has shown an example in which cutout 320 of functional block 306 is formed to open to the outside of the wiring boards, it is not so limited. Similar effects can be produced as well when cutout 320 is arranged in an orientation to open to the inside of the wiring boards. Also, the shape of functional block 306 need not be an exact "U" shape. The shape may be such that functional block 306 surrounds three sides of anisotropically conductive member 105 or restricts the positions of two opposing sides of anisotropically conductive member 105, and functional block 306 surrounding anisotropically conductive member 105 restrains the linear expansion of anisotropically conductive member 105 even if the ambient temperature changes.

Figure 17:
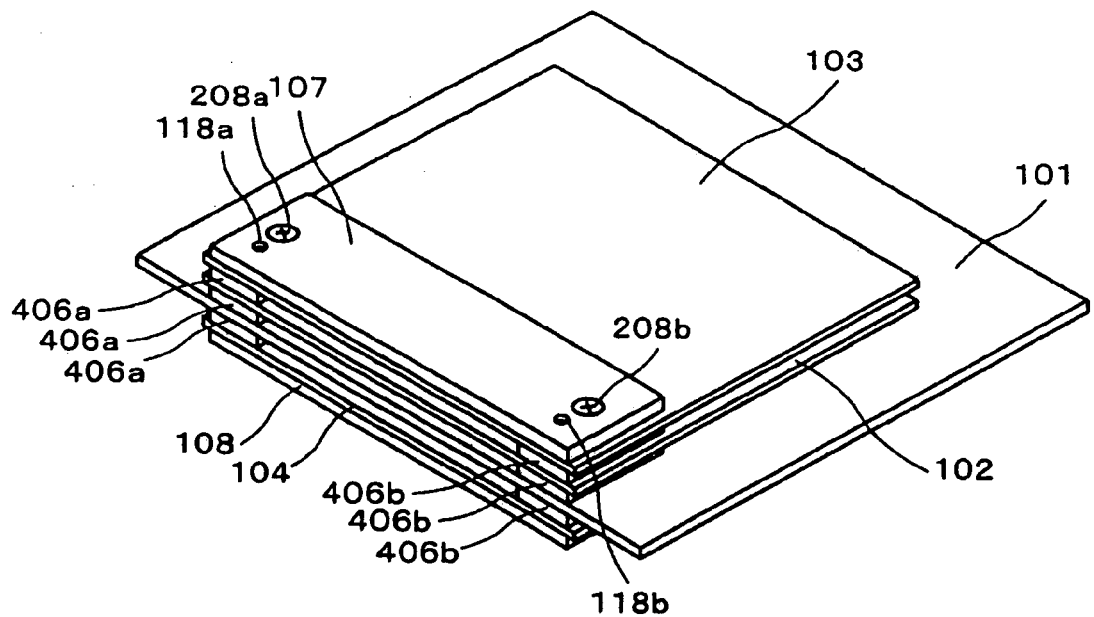
FIG. 17
A schematic perspective view showing a circuit board device according to a fourth embodiment of the present invention.
Figure 18:
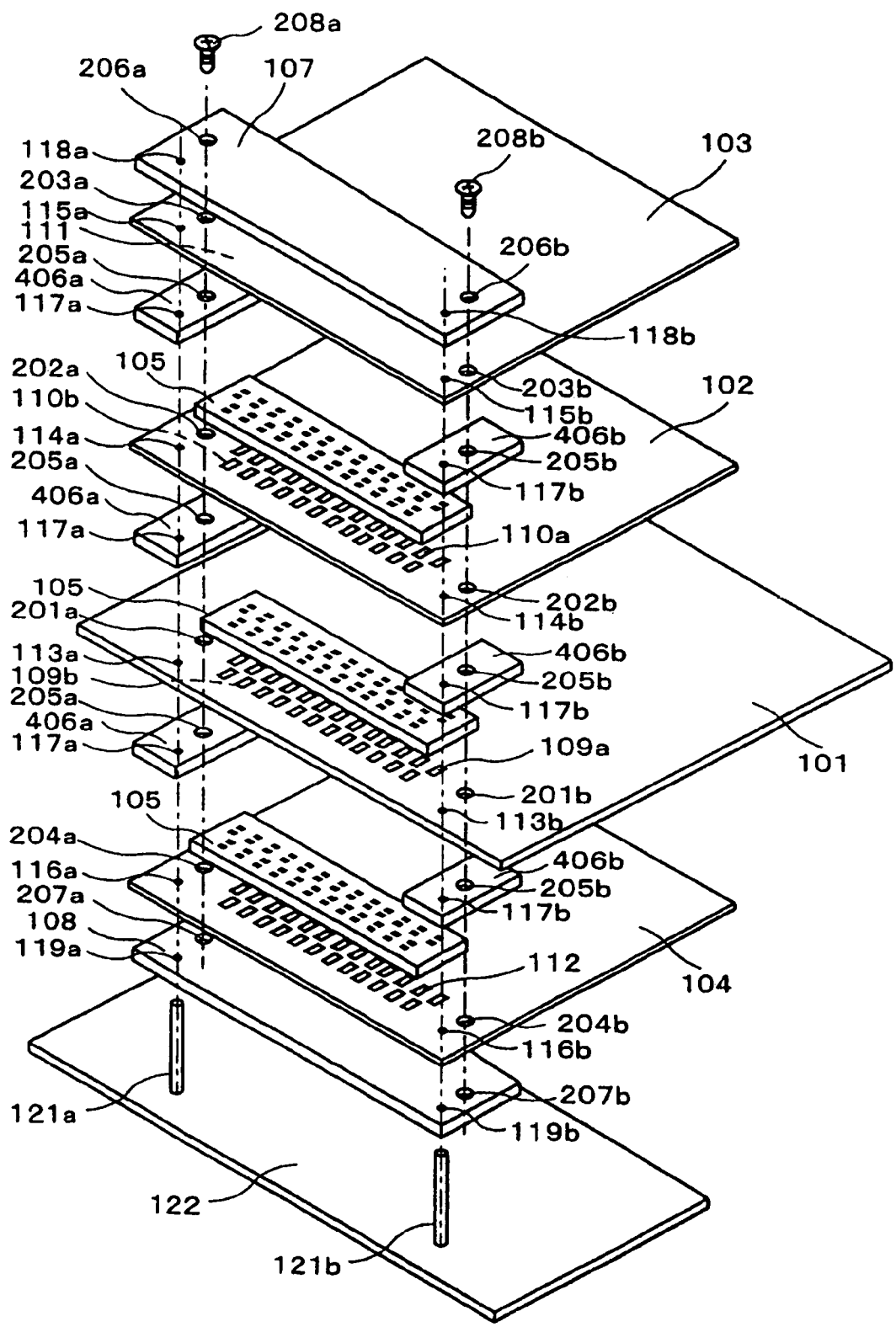
FIG. 18
An exploded perspective view showing the configuration of the circuit board device and a wiring board connecting method according to the fourth embodiment of the present invention.
Figure 19:
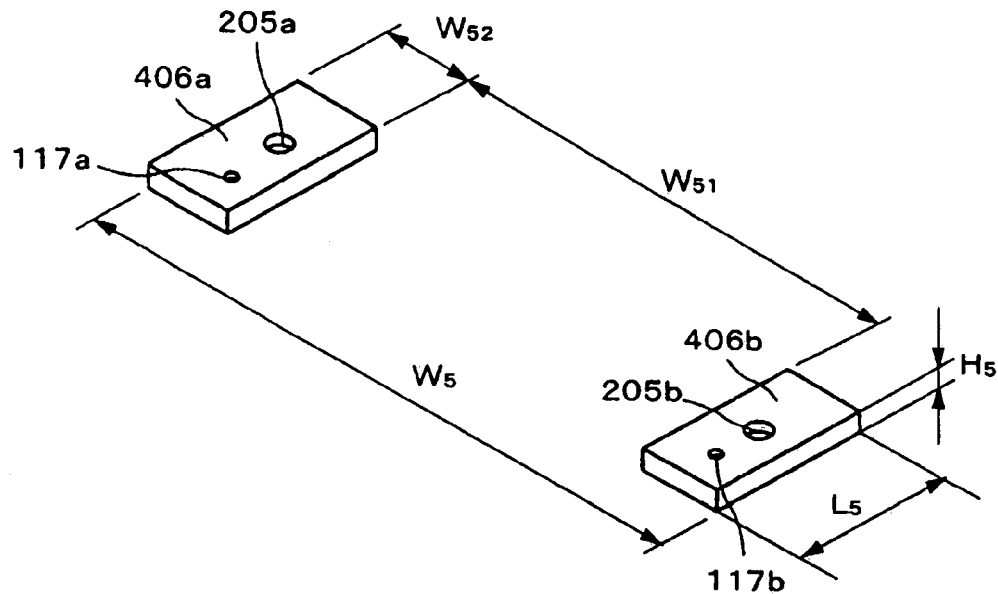
FIG. 19
A schematic perspective view showing functional block 406 of the circuit board device according to the fourth embodiment of the present invention.

Next, a fourth embodiment of the present invention will be described. FIG. 17 is a schematic perspective view showing a circuit board device according to this embodiment, FIG. 18 is an exploded perspective view showing the configuration of the circuit board device and a wiring board connecting method according to this embodiment, and FIG. 19 is a schematic perspective view showing functional block 406 of the circuit board device according to this embodiment. In FIGS. 17 through 19, the same components as those in FIGS. 6 through 16 are designated the same reference numerals, and detailed descriptions thereon are omitted.

In the second embodiment described above, functional block 106 is in the shape of a frame which comprises through window 120 as an opening in which anisotropically conductive member 105 is fitted, and anisotropically conductive member 105 is fitted in this through window 120. On the other hand, in this embodiment, a functional block comprises two functional blocks 406a and 406b as shown in FIGS. 17 through 19, and these functional blocks 406a and 406b are arranged in contact with two latitudinal sides of anisotropically conductive member 105. The rest is similar in structure to the second embodiment.

Functional blocks 406a and 406b are two blocks which are formed to be parallel with the two latitudinal sides of anisotropically conductive member 105, and are basically made of a metal material. Each is provided with positioning throughhole 117a and screw escape throughhole 205a, and positioning throughhole 117b and screw escape throughhole 205b. The two latitudinal sides of anisotropically conductive member 105 are in contact with functional blocks 406a and 406b, while two longitudinal sides thereof are opened. In this way, when anisotropically conductive member 105 is compressed, anisotropically conductive member 105 expands so as to increase the area of a contact surface with a wiring board on these two opened sides. As a result, it is possible to prevent an impact resilient force from being excessively applied in the compression direction by anisotropically conductive member 105.

For functional blocks 406a and 406b, stainless steel, for example, can be used as a metal material. Similar to the second embodiment described above, thickness $H_5$ of functional blocks 406a and 406b can be chosen to be $H_5$=0.25 mm, i.e, compression ratio is 16.7%, in order to ensure a compression amount in a range of 10 to 45% which can result in stable electric resistance, from the relationship between the compression ratio and the DC electric resistance of anisotropically conductive member 105 shown in FIG. 13.

Also, the insulating elastic resin material, which is the base material of anisotropically conductive member 105, does not characteristically change the volume even after compression. In this embodiment, however, in consideration of the fact that the two longitudinal sides of anisotropically conductive member 105 are completely opened, the amount of expansion 6 is calculated on a contact surface having a wiring board facing the opened side by the following Equation 5 which represents the relationship before and after compression of the insulating elastic resin material, δ=0.24 mm, is derived. From this fact, in order to prevent an instantaneous signal break (in here, a signal break for 1 μsec or longer) when an impulse-like external force such as drop impact force is applied, as well as the case where a static external force is applied, composite inherent period T of functional blocks 406a, 406b and holding blocks 107, 108 can be calculated by the following Equation 6 such that it is equal to or less than 1 μsec, taking into consideration the amount of expansion δ of compressed anisotropically conductive member 105 and a slight margin, and $L_5$=1.5 mm can be derived. Here, λ is a first-order solution for a characteristic equation of a cantilever, where λ=1.8751, E and ρ are the Young's modulus and density of stainless steel, where E=197 GPa, and ρ=8000 kg/m³, respectively, I is a second moment of area at length $W_{52}$ in the latitudinal direction of functional blocks 406a and 406b, where I=$W_{52}$×$H_5$/12, and A is the sum total of cross-sectional areas, where A=$W_{52}$×H, H=3×$H_5$+2×$H_3$. Also, $W_{51}$=$W_1$=4.2 mm, and $W_5$=7.2 mm can be chosen.

$$\delta = L_1 \cdot \left(\frac{H_1}{H_5} - 1\right) \quad \text{[Equation 5]}$$

$$T = \frac{2\pi}{\left(\frac{\lambda}{L_5/2}\right)^2 \cdot \left(\frac{EI}{\rho A}\right)^{\frac{1}{2}}} \quad \text{[Equation 6]}$$

Here, it should be understood that thickness $H_3$ of holding blocks 107 and 108 is optimized by the foregoing Equation 6 when $L_5$ of functional blocks 406a and 406b is calculated.

Next, a description will be given of the operation of the circuit board device according to this embodiment, configured as described above. In the circuit board device according to this embodiment, functional blocks 406a and 406b restrict the positions of the two opposing sides of anisotropically conductive member 105, and the remaining two sides of anisotropically conductive member 105 are opened. From this fact, when anisotropically conductive member 105 is compressed by keeping holding blocks 107 and 108 compressed, it is possible to prevent the impact resilient force from being excessively applied in the compression direction by anisotropically conductive member 105.

Also, even if the ambient temperature changes, functional blocks 406a and 406b, which restrict the positions of the two latitudinal sides of anisotropically conductive member 105, restrain linear expansion of anisotropically conductive member 105. It is therefore possible to provide stable electric connections between the wiring boards without causing a large shift between the wiring boards and anisotropically conductive members 105.

Also, since anisotropically conductive member 105 is used as an electric connector between the respective wiring boards, functional blocks 406a and 406b are placed on the same plane as anisotropically conductive member 105, and they are sandwiched and held compressed by holding blocks 107 and 108, functional blocks 406a and 406b restrain deformations of each wiring board and fluctuations in the impact resilient force of anisotropically conductive members 105 placed between the wiring boards when a static external force is applied to the circuit board device. Consequently, it is possible to realize a circuit board device having stable DC electric resistance.

Also, when the circuit board device is deformed by an impulse-like external force such as a drop impact force applied thereto, composite inherent period T of functional blocks 406a, 406b and holding blocks 107, 108 is calculated and set to be equal to or less than an instantaneous signal break restraint time (one μ sec or less in this embodiment), so that the impact resilient force of anisotropically conductive member 105 will not fluctuate within the signal break restraint time. Consequently, it is possible to realize a circuit board device which has stable DC electric resistance.

Further, in this circuit board device, the compression ratio of anisotropically conductive member 105 is controlled within an optimal range by functional blocks 406a and 406b. Thus, even if an increased number of wiring boards are laminated, it is possible to restrain variations in the impact resilient force of each anisotropically conductive member 105 and to realize a circuit board device which has stable DC electric resistance with the aid of the effects of restraining deformations of the wiring boards and restraining the linear expansion of anisotropically conductive member 105 by functional blocks 406a and 406b.

In this embodiment, with anisotropically conductive member 105 sandwiched by two sides of two functional blocks 406a and 406b, when the ambient temperature changes, the expansion due to the temperature change of anisotropically conductive member 105 can be restrained in the direction in which this expansion is the largest. Thus, in comparison with the circuit board device according to the second embodiment, this embodiment particularly excels in the stability of the DC electric resistance. Further, since the functional block is divided into two pieces 406a and 406b, this embodiment is more advantageous in reducing size and weight, as compared with the second and third embodiments. Further, since functional blocks 406a and 406b are formed such that they are parallel with two latitudinal sides of anisotropically conductive member 105, no consideration must be made for a change in dimensions in the direction along the longitudinal sides after the compression of anisotropically conductive member 105 occurs. In this way, functional blocks 406a and 406b can also be utilized for the positioning of anisotropically conductive member 105 to each wiring board.

Figure 20A:
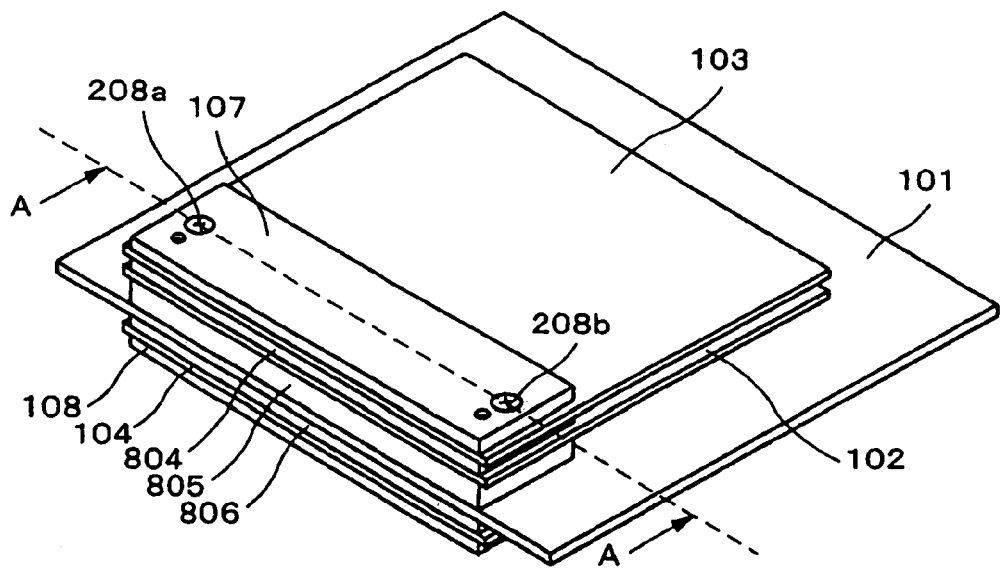
FIG. 20a
A schematic perspective view showing a circuit board device according to a fifth embodiment of the present invention.
Figure 20B:
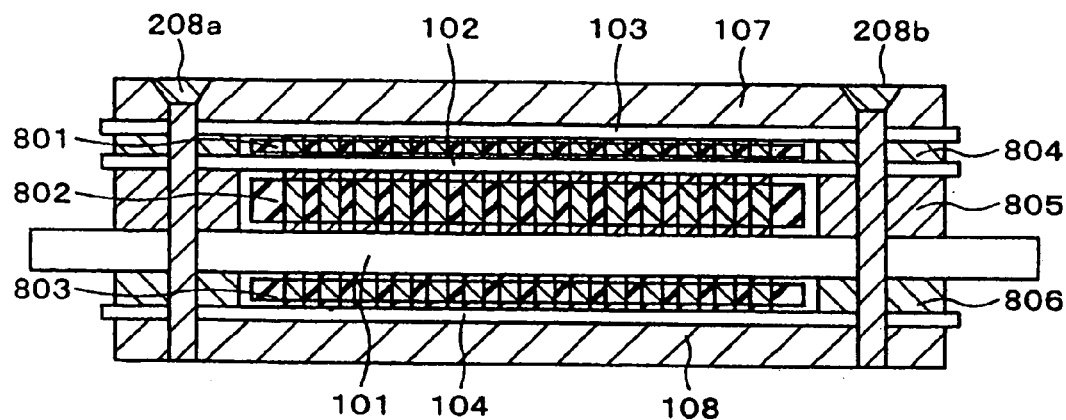
Figure 21:
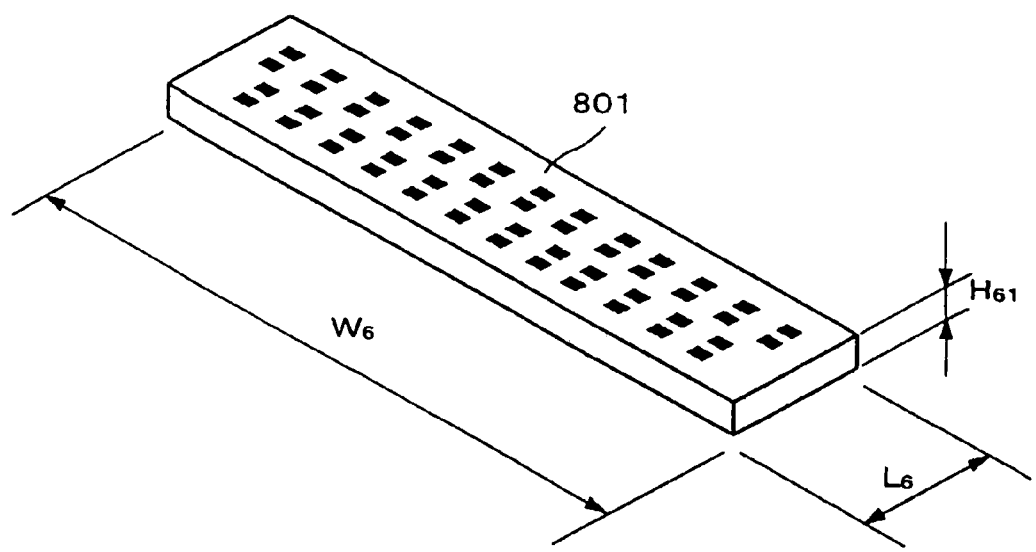
FIG. 21
A schematic perspective view showing functional block 801 of the circuit board device according to the fifth embodiment of the present invention.
Figure 22:
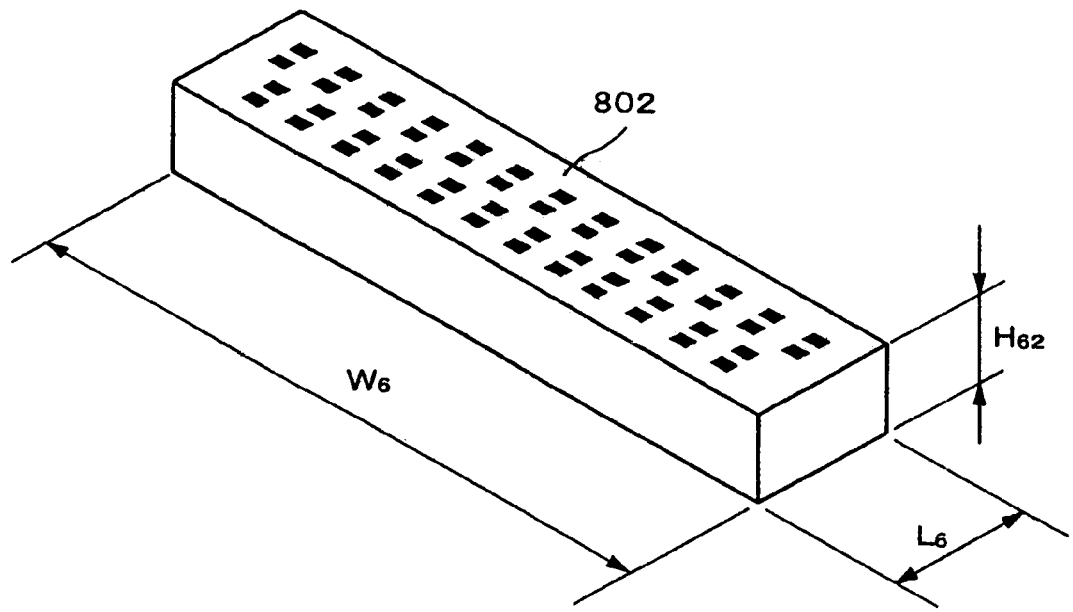
FIG. 22
A schematic perspective view showing functional block 802 of the circuit board device according to the fifth embodiment of the present invention.
Figure 23:
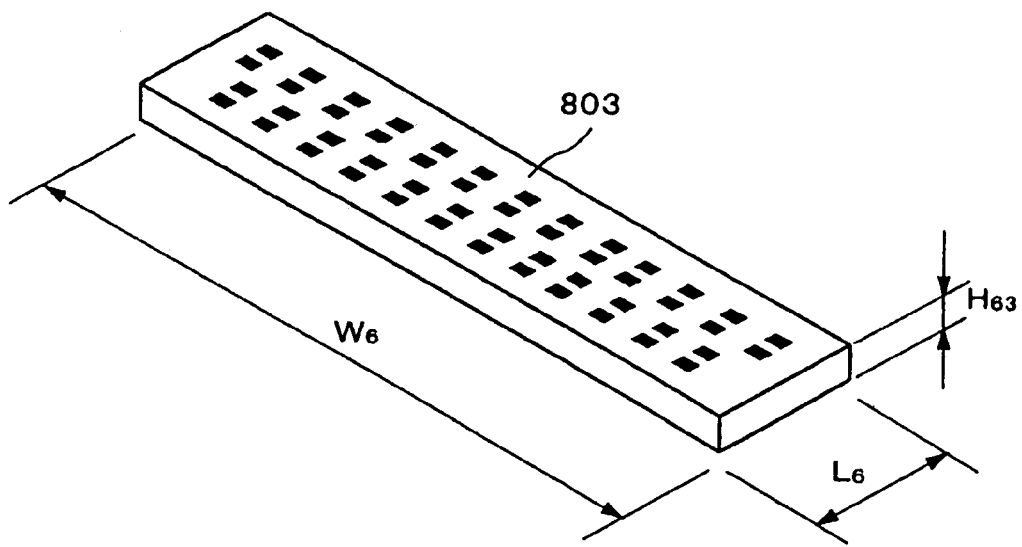
FIG. 23
A schematic perspective view showing functional block 803 of the circuit board device according to the fifth embodiment of the present invention.

Next, a fifth embodiment of the present invention will be described. FIG. 20a is a schematic perspective view showing a circuit board device according to this embodiment, FIG. 20b is a cross-sectional view along line A-A in FIG. 20a, FIG. 21 is a schematic perspective view showing functional block 801 of the circuit board device according to this embodiment, FIG. 22 is a schematic perspective view showing functional block 802 of the circuit board device according to this embodiment, and FIG. 23 is a schematic perspective view showing functional block 803 of the circuit board device according to this embodiment. In FIGS. 20 through 23, the same components as those in FIGS. 6 through 19 are designated the same reference numerals, and detailed descriptions thereof are omitted.

In the second embodiment described above, each wiring board is laminated through functional block 106 that has anisotropically conductive member 105 fitted therein, and anisotropically conductive member 105 and functional block 106 placed between the respective wiring boards all have the same shape. On the other hand, in this embodiment, anisotropically conductive members placed between respective wiring boards differ in thickness from one another, and functional blocks 801, 802, 803 also differ in thickness from one another accordingly. Others are similar in structure to the second embodiment.

Anisotropically conductive members 801, 802, 803 are anisotropically conductive members which are basically made of an insulating elastic resin material embedded with metal thin lines. Then, similar to the first embodiment, the metal thin lines are embedded at positions corresponding to electrode terminals formed on the front and back surfaces of each wiring board in a vertical direction with respect to the front and back surfaces of each wiring board.

For example, silicone rubber with a rubber hardness of 50 degrees (JIS-K-6249) can be used as the insulating elastic resin material for anisotropically conductive members 801, 802, and 803. Also, a conductive material made of Au-plated stainless wire having a diameter of $\phi$ 12 $\mu$m is used for the metal fine lines. For example, in FIGS. 21 to 23, $W_6$=4.2 mm, $L_6$=1.2 mm, thickness $H_{61}$ of anisotropically conductive member 801, thickness $H_{62}$ of anisotropically conductive member 802, and thickness $H_{63}$ of anisotropically conductive member 803 can be $H_{61}$=0.1 mm, $H_{62}$=0.6 mm, and $H_{63}$=0.3 mm, respectively.

Functional blocks 804, 805, and 806, which are basically made of a metal material, have positioning throughholes 117a and 117b, and are formed with through windows 120 corresponding to the outside shapes of respective anisotropically conductive members 801, 802, and 803 to have a frame-like shape. Then, anisotropically conductive members 801, 802, and 803 are fitted in these through windows 120, respectively. Similar to the second embodiment described above, the thicknesses of functional blocks 804, 805, and 806 can be optimized so as to ensure the compression amount of 10 to 45% which can result in a stable electric resistance of anisotropically conductive members 801, 802, and 803. Also, each dimension of holding blocks 107 and 108 can be optimized in a manner similar to the second embodiment described above.

Next, a description will be given of the operation of the circuit board device according to this embodiment, configured as described above. The circuit board device according to this embodiment employs anisotropically conductive members 801, 802, and 803 which are fitted in through windows 120 of functional blocks 804, 805, and 806, respectively, for making an electric connector between the respective wiring boards. Then, they are sandwiched by holding blocks 107 and 108, anisotropically conductive members 801, 802, 803 sandwiched between the respective wiring boards are respectively compressed to the thicknesses of functional blocks 804, 805, and 806, and in this state, screws 208a and 280b are joined into screw joining tap holes 207a provided at both longitudinal ends of holding block 108 from above holding block 107.

In the circuit board device according to this embodiment, by forming anisotropically conductive members 801, 802, and 803 while varying their respective thicknesses $H_{61}$, $H_{62}$ and $H_{63}$, it is possible to arbitrarily select a distance between wiring boards in accordance with the height of parts (not shown) mounted on each wiring board. In this way, mounted parts available on each wiring board can be selected from wider options. Also, stable electric connections can be made between wiring boards without causing problems due to contact of mounted parts with each other on wiring boards. Further, it is possible to realize a circuit board device in which the DC electric resistance is very stable.

Figure 24B:
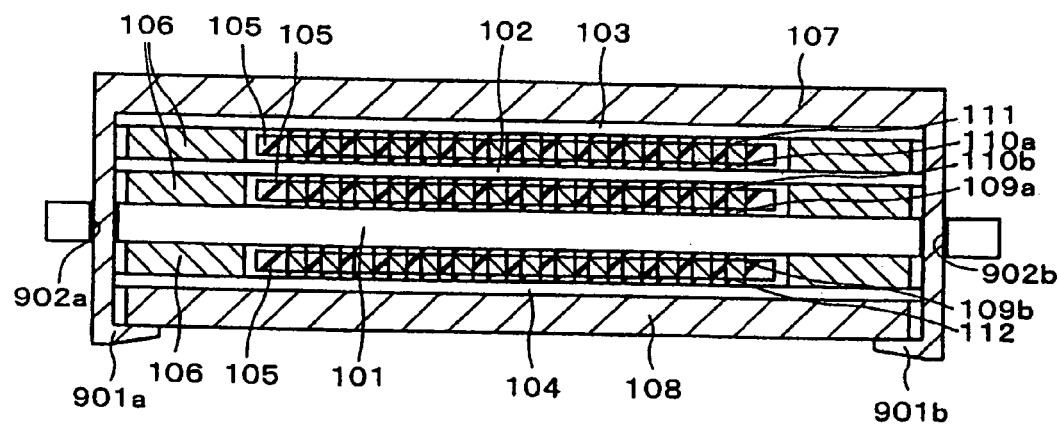
FIG. 24b
Figure 25:
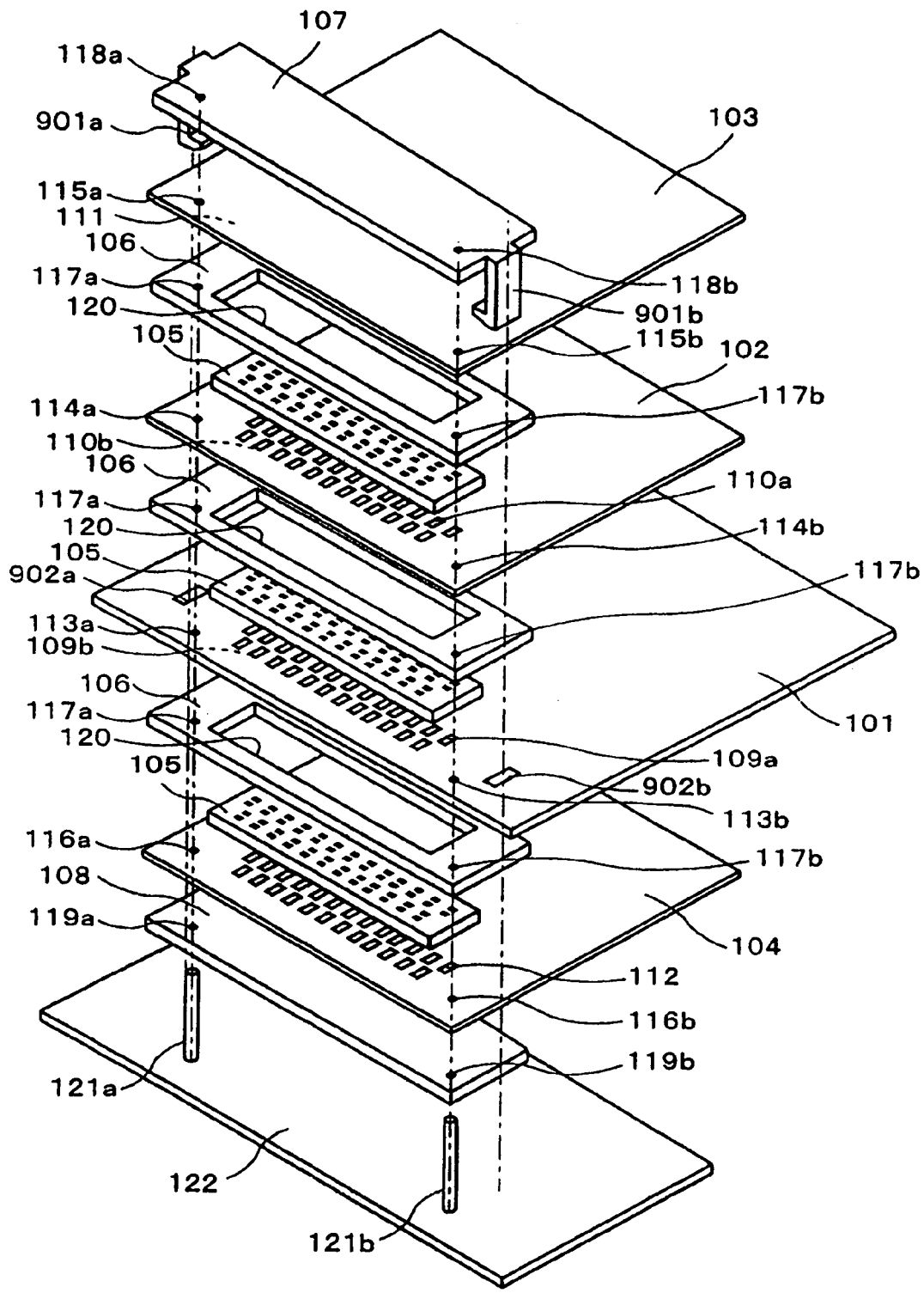

Next, a sixth embodiment will be described. FIG. 24a is a schematic perspective view showing a circuit board device according to this embodiment, FIG. 24b is a cross-sectional view along line A-A in FIG. 24a, and FIG. 25 is an exploded perspective view showing the configuration of the circuit board device and a wiring board connecting method according to this embodiment. In FIGS. 24 and 25, the same components as those in FIGS. 6 through 23 are designated the same reference numerals, and detailed descriptions thereon are omitted.

In the first embodiment described above, the circuit board device is applied with pressure by a clamp jig (not shown) or the like, whereby anisotropically conductive member 105 sandwiched between the respective wiring boards is compressed to the thickness of functional block 106, and this state is maintained. On the other hand, in this embodiment, the circuit board device is applied with pressure by stopper tabs 901a and 901b formed on holding block 107, instead of with pressure applied by the clamp jig (not shown) or the like, and a wiring board which has a larger shape than holding block 107 in the longitudinal direction is formed having stopper tab throughholes 902a and 902b for extending these stopper tabs 901a and 901b therethrough. The rest is similar in structure to the first embodiment.

As shown in FIGS. 24 and 25, in the circuit board device according to this embodiment, stopper tabs 901a and 901b are formed at both longitudinal ends of holding block 107. Then, stopper tab throughholes 902a and 902b are formed at sites corresponding to stopper tabs 901a and 901b of holding block 107, of first wiring board 101 which has a larger shape than holding block 107 in the longitudinal direction. Then, similar to the first embodiment, holding block 108, fourth wiring board 104, functional block 106 having anisotropically conductive member 105 fitted in through window 120, first wiring board 101, functional block 106 having anisotropically conductive member 105 fitted in through window 120, second wiring board 102, functional block 106 having anisotropically conductive member 105 fitted in through window 120, and third wiring board 103 are laminated, respectively, in a state where they are accurately positioned. When holding block 107 is laminated from thereabove, stopper tabs 901a and 901b formed at both longitudinal ends of holding block 107 extend through stopper tab throughholes 902a and 902b formed through first wiring board 101, and are engaged to the back surface of holding block 108 which is positioned at the lowermost layer. In this event, the length of stopper tabs 901a and 901b in the wiring board laminating direction is set to a length suitable to compress anisotropically conductive member 105 sandwiched between the respective wiring boards to the thickness of functional block 106 and is held in this state.

Next, a description will be given of a wiring board connecting method for the circuit board device according to this embodiment. As shown in FIG. 25, positioning throughholes 119a and 119b provided through holding block 108 are fitted over positioning pins 121a and 121b provided on positioning jig 122. Then, in a manner similar to the first embodiment described above, holding block 108, fourth wiring board 104, functional block 106 having anisotropically conductive member 105 fitted in through window 120, first wiring board 101, a functional block 106 having anisotropically conductive member 105 fitted in through window 120, second wiring board 102, functional block 106 having anisotropically conwiring board 103, and holding block 107 are laminated, respectively, in a state where they are accurately positioned. In this state, stopper tabs 901a and 901b that are provided at both longitudinal ends of holding block 107 are inserted through stopper tab throughholes 902a and 902b provided through first wiring board 101, and are engaged to the back surface of holding block 108 which is positioned at the lowermost layer.

In this event, since the length of stopper tabs 901a and 901b in the wiring board laminating direction is set to a length suitable to compress anisotropically conductive member 105 that is sandwiched between the respective wiring boards to the thickness of functional block 106 and that is held in this state, anisotropically conductive member 105 is compressed to the thickness of functional block 106. In this way, electrode terminals 112 provided on the front surface of fourth wiring board 104 for signal connection are electrically connected to electrode terminals 109b provided on the back surface of first wiring board 101 for signal connection through the conductive area of anisotropically conductive member 105; electrode terminals 109a provided on the front surface of first wiring board 101 for signal connection are electrically connected to electrode terminals 110b provided on the back surface of second wiring board 102 for signal connection through the conductive area of anisotropically conductive member 105; electrode terminals 110a provided on the front surface of second wiring board 102 for signal connection are electrically connected to electrode terminals 111 provided on the back surface of third wiring board 103 for signal connection through the conductive area of anisotropically conductive member 105. In this way, the circuit board device according to this embodiment is formed.

According to the circuit board device according to this embodiment, no steps is required to process the screw escape throughholes through each wiring board 101, 102, 103, 104, and a step for processing the screw joining tap holes in holding block 108 can be omitted. Further, since holding block 107 is provided with stopper tabs 901a and 901b at both longitudinal ends thereof, thereby the circuit board device is kept compressed, no clamp jig or screw is required and the number of parts can be reduced. Accordingly, the circuit board device particularly excels in a reduction in cost and weight.

Figure 26:
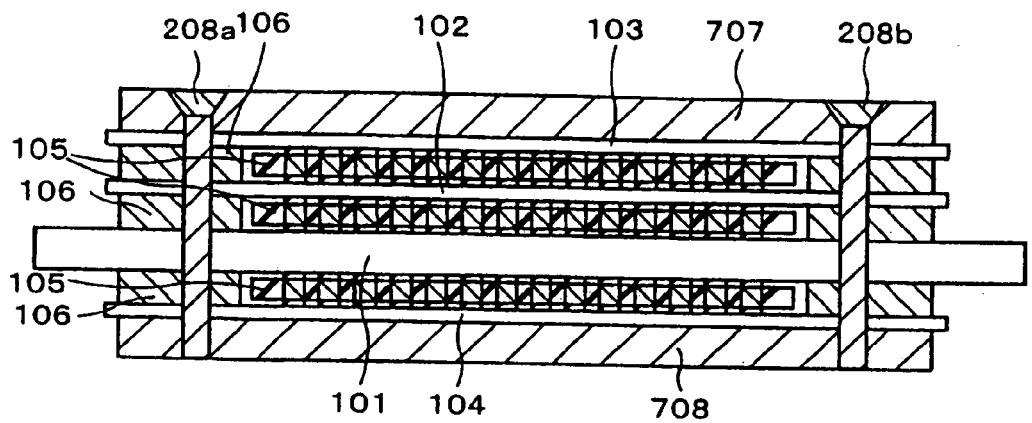
Figure 27:
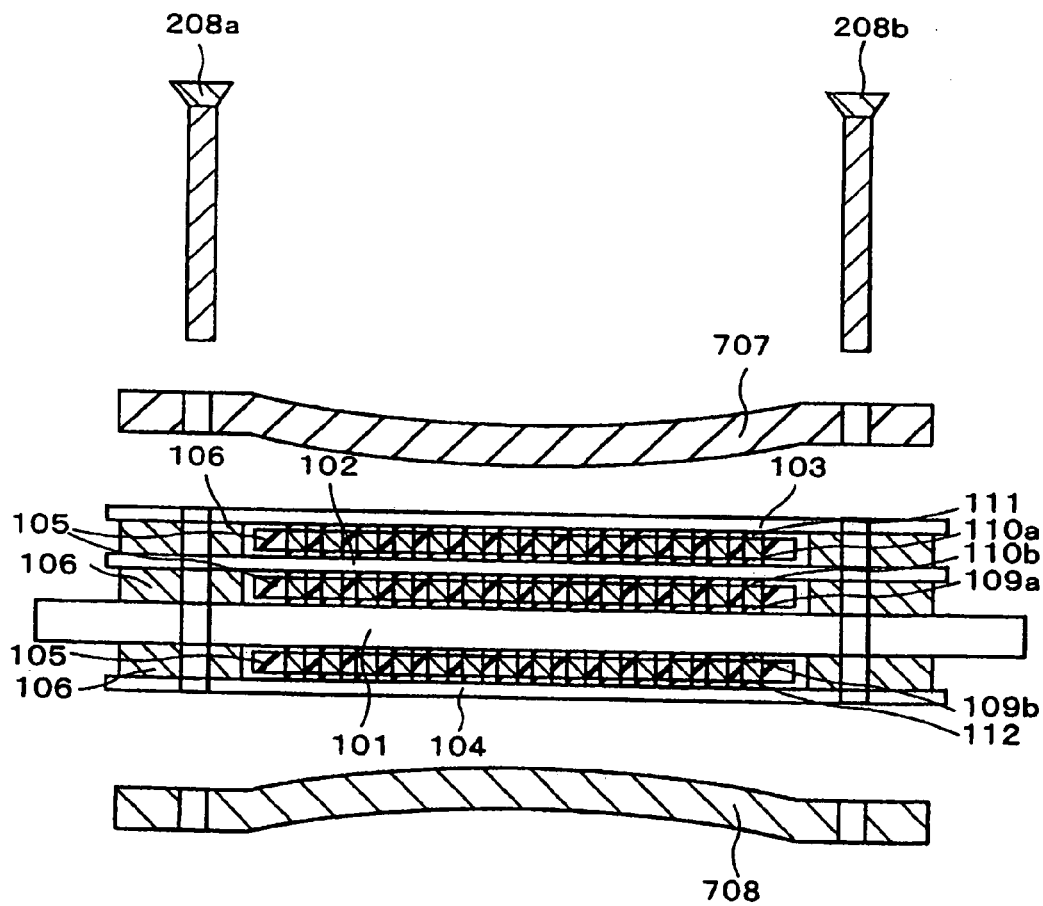

Next, a seventh embodiment of the present invention will be described. FIG. 26 is a schematic perspective view showing a circuit board device according to this embodiment, and FIG. 27 is an exploded cross-sectional view showing the configuration of the circuit board device and a wiring board connecting method according to this embodiment. In FIGS. 26 and 27, the same components as those in FIGS. 6 through 25 are designated the same reference numerals, and detailed descriptions thereon are omitted.

As shown in FIG. 27, in the circuit board device according to this embodiment, holding blocks 707 and 708 for compressing anisotropically conductive members 105 and for holding the circuit board device in this state are formed to be concavely curved toward a direction in which anisotropically conductive member 105 compresses. Others are similar in configuration to the second embodiment.

Next, a description will be given of the operation of the circuit board device according to this embodiment, configured as described above. In the circuit board device according to this embodiment, when anisotropically conductive member 105 is compressed and the circuit board device is held in this state, even if holding blocks 707 and 708 receive a pressure which causes deformation that is convexedly curved toward a direction in which the anisotropically conductive member compresses, due to the impact resilient force applied by anisotropically conductive member 105, the impact resilient force of anisotropically conductive member 105 will not fluctuate within the connection plane of each wiring board with anisotropically conductive member 105 because holding blocks 707 and 708 are formed to be convexedly curved toward the direction in which anisotropically conductive member 105 compresses. Consequently, the circuit board according to this embodiment particularly excels in the stability of the DC electric resistance.

Figure 28:
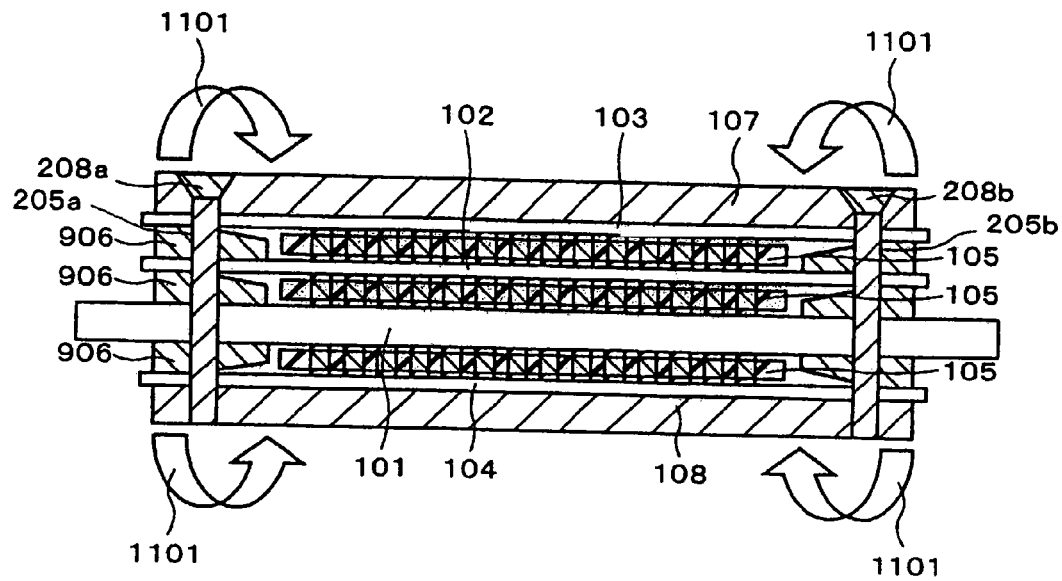
Figure 29:
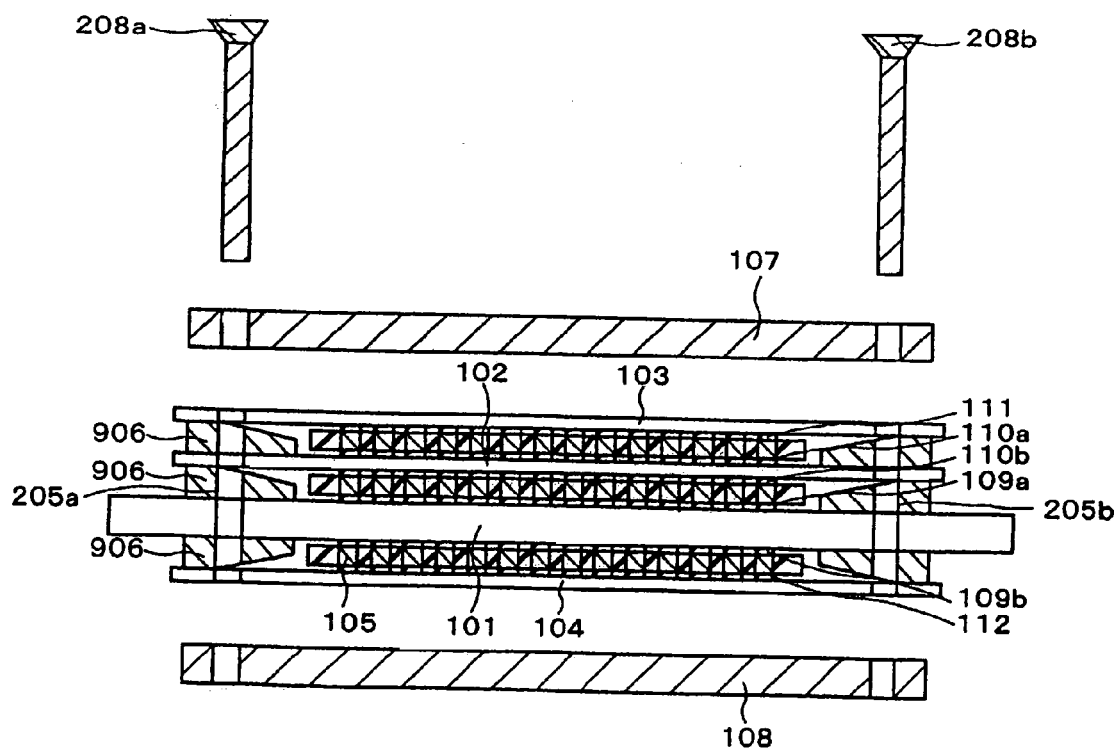

Next, an eighth embodiment of the present invention will be described. FIG. 28 is a schematic perspective view showing a circuit board device according to this embodiment, and FIG. 29 is an exploded cross-sectional view showing the configuration of the circuit board device and a wiring board connecting method according to this embodiment. In FIGS. 28 and 29, the same components as those in FIGS. 6 through 27 are designated the same reference numerals, and detailed descriptions thereon are omitted.

In the second embodiment described above, wiring boards are laminated with the intervention of functional block 106 having anisotropically conductive member 105 fitted therein between the respective wiring boards, where functional block 106 that is placed between the respective wiring boards is uniform in thickness. On the other hand, in this embodiment, functional block 906 formed with through window 120 for fitting anisotropically conductive member 105 therein has a thickness which becomes gradually thinner toward the direction in which through window 120, in which anisotropically conductive member 105 is fitted, is formed, inwardly from screw escape throughholes 205a and 205b, i.e., functional block 906 is formed with a smaller thickness toward the anisotropically conductive member. Others are similar in structure to the second embodiment.

As shown in FIGS. 28 and 29, in the circuit board device according to this embodiment, functional block 906 placed between fourth wiring board 104 laminated immediately on holding block 108 and first wiring board 101 is formed such that the thickness of a lower portion becomes gradually thinner toward a direction in which through window 120, in which anisotropically conductive member 105 is fitted, is formed, inwardly from screw escape throughholes 205a and 205b. Also, functional block 906 placed between first wiring board 101 and second wiring board 102 is formed such that the thickness of an upper portion becomes gradually thinner toward the direction in which through window 120, in which anisotropically conductive member 105 is fitted, is formed, inwardly from screw escape throughholes 205a and 205b. Functional block 906 placed between third wiring board 103 laminated immediately below holding block 108 and second wiring board 102 is formed such that the thickness of an upper portion becomes gradually thinner toward the direction in which through window 120, in which anisotropically conductive member 105 is fitted, is formed, inwardly from screw escape throughholes 205a and 205b. In this way, the circuit board device according to this embodiment is constructed.

Next, a description will be given of the operation of the circuit board device according to this embodiment, configured as described above. When anisotropically conductive member 105 is compressed and the circuit board device is held in this state, even if holding blocks 107 and 108 receive pressure which causes deformation that is concavely curved toward a direction in which anisotropically conductive member 105 compresses, due to the impact resilient force applied by anisotropically conductive member 105, the impact resilient force applied by anisotropically conductive member 105 will exert pressure on the end of functional block 906 which has a reduced thickness because functional block 906 is formed to have a thickness which varies to become smaller toward anisotropically conductive member 105. In this way, a moment, which is convexedly curved toward the compressing direction of anisotropically conductive member 105, acts in a direction indicated by arrow 1101, making it possible to restrain deformations of holding blocks 107 and 108. Also, no impact resilient force of anisotropically conductive member 105 fluctuates within the connection surface of each wiring board with anisotropically conductive member 105. Consequently, the circuit board device according to this embodiment particularly excels in the stability of DC electric resistance.

Figure 30:
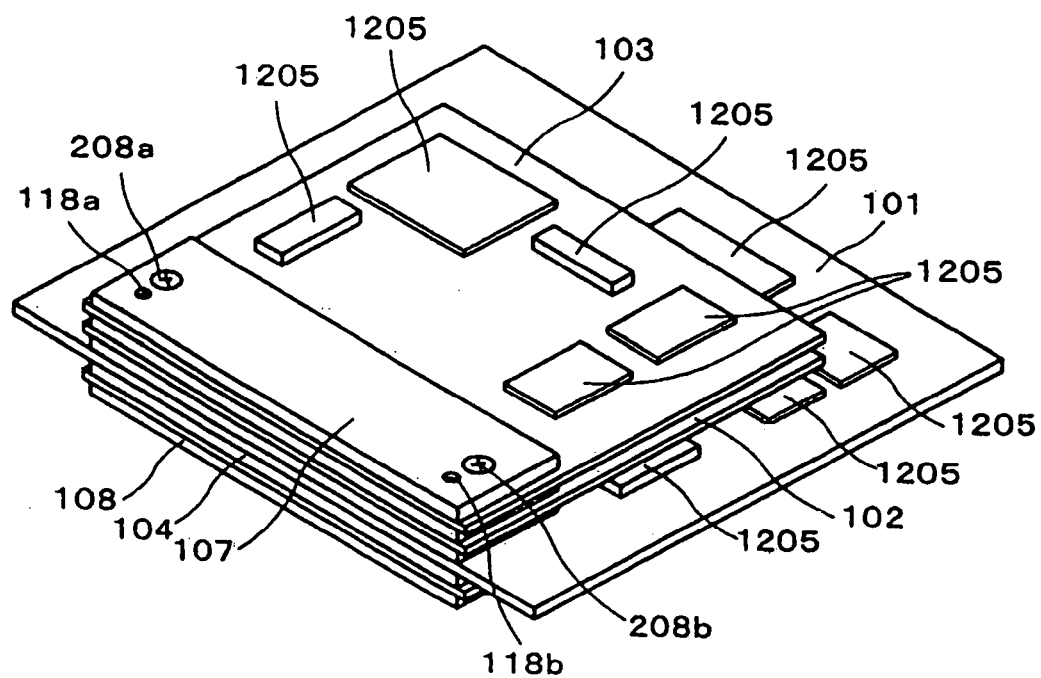
Figure 31:
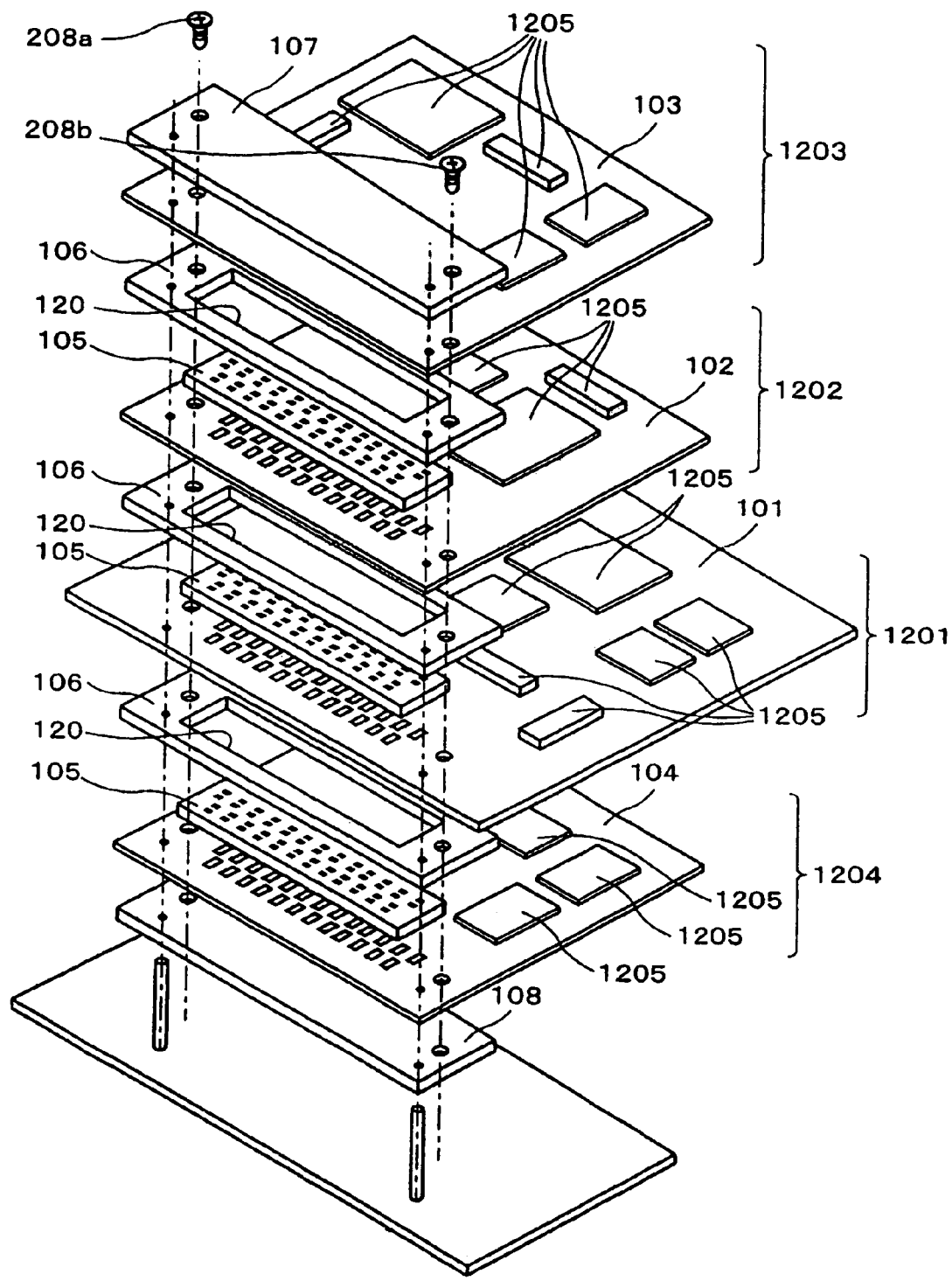

Next, a ninth embodiment of the present invention will be described. FIG. 30 is a schematic perspective view showing a circuit board device according to this embodiment, and FIG. 31 is an exploded cross-sectional view showing the configuration of the circuit board device and a wiring board connecting method according to this embodiment. In FIGS. 30 and 31, the same components as those in FIGS. 6 through 29 are designated the same reference numerals, and detailed descriptions thereon are omitted.

In the circuit board device according to this embodiment, mounted parts 1205 such as LSI (Large Scale Integration: large scale integrated circuit) and the like have been previously surface mounted on first wiring board 101, second wiring board 102, third wiring board 103, and fourth wiring board 104 of the second embodiment described above, and these respective wiring boards form individual functional modules 1201, 1202, 1203, and 1204. Others are similar in structure to the second embodiment.

According to this embodiment, since respective individual functional modules 1201, 1202, 1203, and 1204 which have mounted parts 1205 such as LSI and the like previously surface mounted on the respective wiring boards and which have individual functions are all laminated and electrically connected at one site, it is possible to provide a circuit board module which can realize the compactization associated with a reduction in thickness and volume of an electronic device.

Also, while the circuit board device in this embodiment has been described as having the configuration of the second embodiment described above, it is not so limited, and similar effects can be produced as well when any structure is selected from those described in the first and third through eighth embodiments described above.

EXAMPLES

In the following, a description will be given of examples for demonstrating the effects of the present invention. First, the effects of the present invention will be described in comparison with comparative examples which fall out of the scope of the present invention. A circuit board according to the second embodiment described above was created in the following manner as an example of the present invention.

A rigid printed wiring board basically made of FR4 was used as first wiring board 101; a flexible printed wiring board basically made of polyimide was used as second wiring board 102; a flexible printed wiring board basically made of polyimide was used as third wiring board 103; and a flexible printed wiring board basically made of polyimide was used as fourth wiring board 104.

Also, for example, electrode terminals 109a provided on the front surface of first wiring board 101 and electrode terminals 109b provided on the back surface of the same; electrode terminals 110a provided on the front surface of second wiring board 102 and electrode terminals 110b provided on the back surface of the same; electrode terminals 111 provided on the back surface of third wiring board 103; and electrode terminals 112 provided on the front surface of fourth wiring board 104 were respectively formed with the number of terminals equal to 25, a longitudinal pitch equal to 0.3 mm (L/S=0.15/0.15), a latitudinal pitch equal to 0.8 mm, and terminal dimensions equal to 0.15 (W)×0.5 (L) mm. Then, the respective terminals were set in a staggered arrangement (12 terminals closer to the end of the board, and 13 terminals on the other side).

Anisotropically conductive member 105 was created by selecting silicone rubber with a rubber hardness of 50 degrees (JIS-K-6249) as an insulating elastic resin material and by embedding a electrically conductive material made of Au-plated stainless wires having a diameter of $\phi$ 12 µm as the metal thin lines. The respective dimensions of anisotropically conductive member 105 were such that $W_1$=4.2 mm, $L_1$=1.2 mm, and $H_1$=0.3 mm.

Functional block 106, which employed stainless steel as a metal material, the thickness $H_2$ of which was chosen to be $H_2$=0.25 mm (compression ratio is 16.7%) that falls within the compression ratio in a range of 10 to 45% which can result in a stable electric resistance when anisotropically conductive member 105 was compressed to thickness $H_2$ of functional block 106, as shown in FIG. 13. Also, since the volume of the insulating elastic resin material, which is the base material of anisotropically conductive member 105, does not characteristically change the volume even after compression, the amount of expansion δ on a contact surface with a wiring board is calculated by the aforementioned Equation 2 which represents the relationship before and after compression of the insulating elastic resin material, and δ=0.180625 mm is derived. From this fact, the respective dimensions of functional block 106 were $W_{21}$=$W_1$+0.2 mm=4.4 mm, $L_{21}$=$L_1$+ 0.2 mm=1.4 mm, and $W_2$=7.4 mm taking into consideration this amount of expansion δ and a slight margin.

In regard to $L_2$, in order to prevent an instantaneous signal break (in here, a signal break for 1 µsec or longer) when an impulse-like external force such as drop impact force is applied, as well as the case where a static external force is applied, composite inherent period T of functional block 106, holding block 107 and holding block 108 was calculated by the aforementioned Equation 1 such that it was equal to or less than 1 µsec, and $L_2$=2.3 mm was derived. Here, E and ρ are the Young's modulus and density of stainless steel, where E=197 GPa, and ρ=8000 kg/m³, I is a second moment of area at distance $W_{22}$ from one end of functional block 106 to through window 120 in the longitudinal direction, where I=$W_{22}$×$H_2^3$/12, and A is the sum total of cross-sectional areas, where A=$W_{22}$×H, H=3×$H_2$+2×$H_3$.

For holding blocks 107 and 108, stainless steel was used as a basic metal material. Then, each dimension shown in FIG. 10 was $W_3$=7.4 mm and $L_3$=2.3 mm such that they were the same dimensions as those of functional block 106. Also, thickness $H_3$ of the holding block was $H_3$=0.5 mm by optimizing width $L_2$ of functional block 106 in accordance with the aforementioned Equation 1 when it is calculated.

Then, they were laminated by the wiring board connecting method for the circuit board device, described in the second embodiment, and electrode terminals 112 provided on the front surface of fourth wiring board 104, electrode terminals 109b provided on the back surface of first wiring board 101 and electrode terminals 109a provided on the front surface of first wiring board 101, electrode terminals 110b provided on the back surface of second wiring board 102 and electrode terminals 110a provided on the front surface of second wiring board 102, and electrode terminals 111 provided on the back surface of third wiring board 103 were coupled in a daisy chain fashion, respectively. 15 such circuit board devices were created.

On the other hand, as comparative examples, functional block 106 was not used, and anisotropically conductive member 105 alone was used as an electrical connector between respective wiring boards. Then, electrode terminals 112 provided on the front surface of fourth wiring board 104, electrode terminals 109b provided on the back surface of first wiring board 101 and electrode terminals 109a provided on the front surface of first wiring board 101, electrode terminals 110b provided on the back surface of second wiring board 102 and electrode terminals 110a provided on the front surface of second wiring board 102, and electrode terminals 111 provided on the back surface of third wiring board 103 were coupled in a daisy chain fashion, respectively. 15 such circuit board devices were created.

Five each of the circuit board devices, relative to the example described above and the circuit board devices of the comparative examples, were subjected to; a three-point bending test in which both end sides which formed a right angle with the electrode terminals of the circuit board device were securely fixed, and 196N was applied to the center of the circuit board device; a drop and impact test in which the circuit board device was dropped from the height of 1.5 m; and an environmental temperature test in which the external ambient temperature of the circuit board device was fluctuated in a range of −40° C. to +80° C.

First, evaluation results of the three-point bending test are shown in Table 1 below. The three-point bending test involves securely fixing both end sides which formed a right angle with the electrode terminals of the circuit board device, and applying 196N to the center of the circuit board device, where "◯" was determined when an electric resistance changing ratio was equal to or less than ±50% before and after the three-point bending test, and "x" was determined when it exceeded ±50%. In regard to the electric resistance, a DC electric resistance was measured by a four-point probe method between all electrode terminals which were in series on each of four wiring boards.

TABLE 1

| | Electric Resistance [Ω] | | Changing | |
|---|---|---|---|---|
| | Initial | Applied Load | Ratio [%] | Determination |
| Example 1 | 2.849 | 2.888 | 1.37 | ◯ |
| Example 2 | 3.123 | 3.083 | −1.30 | ◯ |
| Example 3 | 2.954 | 3.014 | 2.03 | ◯ |
| Example 4 | 2.987 | 2.994 | 0.25 | ◯ |
| Example 5 | 3.080 | 3.134 | 1.75 | ◯ |
| Comparative Example 1 | 3.032 | OPEN | ∞ | X |
| Comparative Example 2 | 3.177 | 27.890 | 777.86 | X |
| Comparative Example 3 | 2.952 | 3.893 | 31.86 | ◯ |
| Comparative Example 4 | 3.131 | OPEN | ∞ | X |
| Comparative Example 5 | 3.009 | 21.948 | 629.41 | X |

As shown in Table 1 above, in the case of the four-layer laminated circuit board devices according to Examples 1 through 5, the changing ratio of DC electric resistance is 1.37% in Example 1; −1.30% in Example 2; 2.03% in Example 3; 0.25% in Example 4; and 1.75% in Example 5. On the other hand, in the case of the four-layer laminated circuit board devices according to Comparative Examples 1 through 5, the changing ratio of DC electric resistance is ∞ % in Comparative Example 1; 777.86% in Comparative Example 2; 31.86% in Comparative Example 3; ∞ % in Comparative Example 4; and 629.41% in Comparative Example 5. From this, it was demonstrated that the circuit board devices according to the present examples which comprise anisotropically conductive member 105 and functional block 106 placed between the respective wiring boards exhibit higher stability of the DC electric resistance, when a wiring board was deformed due to a static external force applied thereto, than the circuit board devices according to the comparative examples which do not comprise anisotropically conductive member 105 and functional block 106 placed between the respective wiring boards.

Next, evaluation results of the drop and impact test are shown in Table 2 below. The drop and impact test involved dropping the circuit board device from a height of 1.5 m, and "◯" was determined when the electric resistance changing ratio was equal to or less than ±50% before and after the drop and impact test, and an instantaneous break of 1 μsec or more did not occur, and "x" was determined otherwise. In regard to the electric resistance, DC electric resistance was measured by a four-point probe method between all electrode terminals which were in series on each of four wiring boards.

TABLE 2

| | Electric Resistance [Ω] | | | Presence or | |
|---|---|---|---|---|---|
| | Initial | After Drop | Changing Ratio [%] | Absence of Break | Determination |
| Example 6 | 3.150 | 3.167 | 0.52 | Absence | ◯ |
| Example 7 | 2.972 | 3.008 | 1.21 | Absence | ◯ |
| Example 8 | 3.047 | 3.084 | 1.13 | Absence | ◯ |
| Example 9 | 3.017 | 3.153 | 4.53 | Absence | ◯ |
| Example 10 | 2.999 | 3.014 | 0.50 | Absence | ◯ |
| Comparative Example 6 | 2.970 | 3.504 | 17.98 | Presence | X |
| Comparative Example 7 | 3.144 | 7.590 | 141.41 | Presence | X |
| Comparative Example 8 | 3.243 | OPEN | ∞ | Presence | X |
| Comparative Example 9 | 3.135 | 3.554 | 13.35 | Presence | X |
| Comparative Example 10 | 2.948 | 3.203 | 8.65 | Presence | X |

As shown in Table 2 above, in the case of the four-layer laminated circuit board devices according to Examples 6 through 10, the changing ratio of the DC electric resistance was 0.52% in Example 6; 1.21% in Example 7; 1.23% in Example 8; 4.53% in Example 9; and 0.50% in Example 10, and it was confirmed that no instantaneous break of 1 μsec or more occurred. In the case of the four-layer laminated circuit board devices according to Comparative Examples 6 through 10, the changing ratio of the DC electric resistance was 17.98% in Comparative Example 6; 141.41% in Comparative Example 7; ∞ % in Comparative Example 8; 13.35% in Comparative Example 9; and 8.65% in Comparative Example 10, and instantaneous breaks of 1 μsec or more occurred on all the circuit board devices. From this, it was demonstrated that the circuit board devices according to the present examples which comprise anisotropically conductive member 105 and functional block 106 placed between the respective wiring boards exhibit higher stability of the DC electric resistance, when a wiring board was deformed due to an impulse-like external force, such as a drop and impact force or the like, applied thereto, than the circuit board devices according to the comparative examples which do not comprise anisotropically conductive member 105 and functional block 106 placed between the respective wiring boards.

Next, evaluation results of the ambient temperature test are shown in Table 3 below. The ambient temperature test involves varying the external ambient temperature of circuit board devices in a range of −40° C. to +80° C., and "○" is determined when the electric resistance changing ratio was equal to or less than ±50% before and after the ambient temperature test, and "x" was determined when it exceeded ±50%. In regard to electric resistance, DC electric resistance was measured by a four-point probe method between all electrode terminals which were in series on each of four wiring boards.

TABLE 3

|  | Electric Resistance [Ω] | | Changing | |
| --- | --- | --- | --- | --- |
|  | Initial | Applied Load | Ratio [%] | Determination |
| Example 11 | 2.874 | 2.973 | 3.44 | ○ |
| Example 12 | 2.960 | 3.018 | 1.98 | ○ |
| Example 13 | 2.886 | 2.990 | 3.59 | ○ |
| Example 14 | 2.933 | 3.032 | 3.38 | ○ |
| Example 15 | 2.978 | 3.014 | 1.21 | ○ |
| Comparative Example 11 | 2.982 | 3.489 | 17.00 | ○ |
| Comparative Example 12 | 2.964 | 3.587 | 21.00 | ○ |
| Comparative Example 13 | 2.987 | 8.884 | 196.13 | X |
| Comparative Example 14 | 3.197 | 16.439 | 414.27 | X |
| Comparative Example 15 | 3.057 | 12.008 | 292.79 | X |

As shown in Table 3 above, in the case of the four-layer laminated circuit board devices according to Examples 11 through 15, the changing ratio of DC electric resistance is 3.44% in Example 11; 1.98% in Example 12; 3.59% in Example 13; 3.38% in Example 14; and 1.21% in Example 15. On the other hand, in the case of the four-layer laminated circuit board devices according to Comparative Examples 11 through 15, the changing ratio of DC electric resistance is 17.00% in Comparative Example 11; 21.00% in Comparative Example 12; 196.13% in Comparative Example 13; 414.27% in Comparative Example 14; and 292.79% in Comparative Example 15. From this, it was demonstrated that the circuit board devices according to the present examples which comprise anisotropically conductive member 105 and functional block 106 placed between the respective wiring boards exhibit higher stability of the DC electric resistance, when the ambient temperature varies, than the circuit board devices according to the comparative examples which do not comprise anisotropically conductive member 105 and functional block 106 placed between the respective wiring boards.

Next, for the circuit board device according to the present invention which employs anisotropically conductive member 105 embedded in through window 120 of functional block 106 as an electric connection medium between respective wiring boards, five each of two-layer laminated, four-layer laminated, six-layer laminated, and eight-layer laminated circuit board devices are created using evaluation boards which can couple electrode terminals on the front and back surfaces in a daisy chain fashion. In order to compare them, for circuit board devices which employ only anisotropically conductive member 105 as an electrical connector between respective wiring board without functional block 106, five each of two-layer laminated, four-layer laminated, six-layer laminated, and eight-layer laminated circuit board devices are created using the evaluation boards. Then, they were subjected to the drop and impact test which involved dropping the circuit board device from a height of 1.5 m, which is the most severe of the three types of reliability tests, and "○" was determined when no instantaneous break of 1 μsec or more occurred, and otherwise "x" was determined. In regard to electric resistance, DC electric resistance was measured by a four-point probe method between all electrode terminals which were in series on each of four wiring boards.

TABLE 4

| | Two Layers<br>Presence or Absence of instantaneous break |
| --- | --- |
| Example 16 | Absence ○ |
| Example 17 | Absence ○ |
| Example 18 | Absence ○ |
| Example 19 | Absence ○ |
| Example 20 | Absence ○ |
| Comparative Example 16 | Presence X |
| Comparative Example 17 | Presence X |
| Comparative Example 18 | Absence ○ |
| Comparative Example 19 | Presence X |
| Comparative Example 20 | Absence ○ |

TABLE 5

| | Four Layers<br>Presence or Absence of instantaneous break |
| --- | --- |
| Example 21 | Absence ○ |
| Example 22 | Absence ○ |
| Example 23 | Absence ○ |
| Example 24 | Absence ○ |
| Example 25 | Absence ○ |
| Comparative Example 21 | Presence X |
| Comparative Example 22 | Presence X |
| Comparative Example 23 | Presence X |
| Comparative Example 24 | Presence X |
| Comparative Example 25 | Presence X |

TABLE 6

| | Six Layers<br>Presence or Absence of instantaneous break |
| --- | --- |
| Example 26 | Absence ○ |
| Example 27 | Absence ○ |
| Example 28 | Absence ○ |
| Example 29 | Absence ○ |
| Example 30 | Absence ○ |
| Comparative Example 26 | Presence X |
| Comparative Example 27 | Presence X |
| Comparative Example 28 | Presence X |
| Comparative Example 29 | Presence X |
| Comparative Example 30 | Presence X |

TABLE 7

| | Eight Layers<br>Presence or Absence of instantaneous break |
| --- | --- |
| Example 31 | Absence ○ |
| Example 32 | Absence ○ |
| Example 33 | Absence ○ |
| Example 34 | Absence ○ |
| Example 35 | Absence ○ |
| Comparative Example 31 | Presence X |
| Comparative Example 32 | Presence X |
| Comparative Example 33 | Presence X |
| Comparative Example 34 | Presence X |
| Comparative Example 35 | Presence X |

As shown in Tables 4 through 7 above, it was confirmed that, in the case of the circuit board devices according to the present examples, none of the types of the two-layer laminated through eight-layer laminated devices suffered from an instantaneous break of 1 μsec or more. In the case of the circuit board devices of the comparative examples, two of five two-layer laminated circuit board devices were free from the instantaneous break, whereas the instantaneous break of 1 μsec or more occurred in all types of the remaining four-layer laminated through eight-layer laminated circuit board devices. From this, it was demonstrated that the circuit board devices according to the present examples which employ functional block 106 exhibit the DC electric resistance having higher stability, even when an increased number of wiring boards are laminated, than the circuit board devices according to the comparative examples which do not employ functional block 106.

In the circuit board device according to the present invention, the functional blocks having an anisotropically conductive member fitted therein are placed and laminated between respective wiring boards. From this fact, the electric connections are stable between the wiring boards because the functional blocks restrain deformations of the wiring boards and restrain fluctuations in the impact resilient forces of the anisotropically conductive members even if a static external force or the like is applied.

Also, since the anisotropically conductive member is used as an electrical connector between the wiring boards, the area where the surface of the anisotropically conductive member makes contact with the wiring board expands when the anisotropically conductive member is compressed, thus making it possible to prevent the impact resilient force from being excessively applied by the anisotropically conductive member in the compression direction. Accordingly, the holding blocks need not be increased in thickness, so that a thin circuit board device can be realized.

Also, even if the ambient temperature varies, the functional block restrains a linear expansion of the anisotropically conductive member, so that it is possible to provide stable electric connections between the wiring boards without causing a large shift between the wiring boards and the anisotropically conductive members. Moreover, a circuit board device can be realized in which the DC electrical resistance is highly stable.

Also, since the compression ratio of the anisotropically conductive members is controlled within an optimal range by the functional blocks, variations in the impact resilient force of the anisotropically conductive members are restrained between the respective wiring boards as well even if an increased number of wiring boards are laminated, and since the functional block restrains deformation of each wiring board and a linear expansion of the anisotropically conductive member, it is possible to provide stable electric connections between the wiring boards. Moreover, a circuit board device can be realized having a highly stable DC electric resistance.

Also, even if a wiring board is deformed due to an impulse-like external force, such as a drop and impact force or the like, applied thereto, the impact resilient force of the anisotropically conductive member can be prevented from fluctuating within a signal break restraint time because the composite inherent period T of the functional block and a pair of holding blocks is designed to be equal to or less than an instantaneous signal break restraint time. Accordingly, stable electric connections can be provided between the wiring boards, and a circuit board device can be realized in which the DC electrical resistance is highly stable.

The invention claimed is:

1. A circuit board device comprising:
a plurality of wiring boards;
an anisotropically conductive member placed between said plurality of wiring boards;
a functional block, which is separate from said anisotropically conductive member and is placed on both sides of said anisotropically conductive member in one direction or in a same plane as said anisotropically conductive member so as to surround said anisotropically conductive member; and
a pair of holding blocks placed to clamp said plurality of wiring boards,
wherein a predetermined gap is provided between said anisotropically conductive member and said functional block, and
wherein said plurality of wiring boards are compressed and held as clamped by said pair of holding blocks such that said plurality of wiring boards are electrically connected to each other by said anisotropically conductive member.

2. The circuit board device according to claim 1, wherein said functional block has a shape of a frame which comprises an opening for fitting said anisotropically conductive member therein.

3. The circuit board device according to claim 2, wherein a wiring board selected from a group consisting of a multi-layer flexible printed wiring board, a multi-layer rigid printed wiring board, a two-side flexible printed wiring board, a two-side rigid printed wiring board, a one-side flexible printed wiring board, and a one-side rigid printed wiring board, is used for said plurality of wiring boards.

4. The circuit board device according to claim 2, wherein said anisotropically conductive member comprises:
an electrically conductive material comprising a metal thin line selected from a group consisting of a gold line, a copper line, a brass line, a phosphor bronze line, a nickel line, and a stainless steel line or conductive particles selected from a group consisting of metal particles, gold-plated particles, silver-plated particles, and copper-plated; particles; and
an insulator comprising an insulating elastic resin material.

5. The circuit board device according to claim 1, wherein said functional block has a U-shape to surround three sides of said anisotropically conductive member.

6. The circuit board device according to claim 5, wherein a wiring board selected from a group consisting of a multi-layer flexible printed wiring board, a multi-layer rigid printed wiring board, a two-side flexible printed wiring board, a two-side rigid printed rigid printed wiring board, a two-side flexible printed wiring board, a two-side rigid printed wiring board, a one-side flexible printed wiring board, and a one-side rigid printed wiring board, is used for said plurality of wiring boards.

7. The circuit board device according to claim 5, wherein said anisotropically conductive member comprises:
an electrically conductive material comprising a metal thin line selected from a group consisting of a gold line, a copper line, a brass line, a phosphor bronze line, a nickel line, and a stainless steel line or conductive particles selected from a group consisting of metal particles, gold-plated particles, silver-plated particles, and copper-plated particles; and
an insulator comprising an insulating elastic resin material.

8. The circuit board device according to claim 1, wherein said functional block comprises two blocks which restrain positions of two opposing sides of said anisotropically conductive member.

9. The circuit board device according to claim 8, wherein a wiring board selected from a group consisting of a multi-layer flexible printed wiring board, a multi-layer rigid printed wiring board, a two-side flexible printed wiring board, a two-side rigid printed wiring board, a one-side flexible printed wiring board, and a one-side rigid printed wiring board, is used for said plurality of wiring boards.

10. The circuit board device according to claim 8, wherein said anisotropically conductive member comprises:
    an electrically conductive material comprising a metal thin line selected from a group consisting of a gold line, a copper line, a brass line, a phosphor bronze line, a nickel line, and a stainless steel line or conductive particles selected from a group consisting of metal particles, gold-plated particles, silver-plated particles, and copper-plated particles; and
    an insulator comprising an insulating elastic resin material.

11. The circuit board device according to claim 1, wherein a wiring board selected from a group consisting of a multi-layer flexible printed wiring board, a multi-layer rigid printed wiring board, a two-side flexible printed wiring board, a two-side rigid printed wiring board, a one-side flexible printed wiring board, and a one-side rigid printed wiring board, is used for said plurality of wiring boards.

12. The circuit board device according to claim 1, wherein said anisotropically conductive member comprises:
    an electrically conductive material which comprises a metal thin line selected from a group consisting of a gold line, a copper line, a brass line, a phosphor bronze line, a nickel line, and a stainless steel line or conductive particles selected from a group consisting of metal particles, gold-plated particles, silver-plated particles, and copper-plated particles; and
    an insulator which comprises an insulating elastic resin material.

13. The circuit board device according to claim 1, wherein said anisotropically conductive member is mounted with its thickness being changed.

14. The circuit board device according to claim 1, wherein a composite inherent period of said functional block and said pair of holding blocks is set to a restrained instantaneous signal break time or less.

15. The circuit board device according to claim 1, wherein said plurality of wiring boards are kept compressed by screws for fixing said wiring boards between said holding blocks in a state in which said wiring boards are clamped by said pair of holding blocks.

16. The circuit board device according to claim 1, wherein said plurality of wiring boards are kept compressed by tabs for engaging said holding blocks with said wiring boards respectively, in a state in which said wiring boards are clamped by said pair of holding blocks.

17. The circuit board device according to claim 1, wherein said holding blocks are convexedly curved in a direction in which said anisotropically conductive member is compressed.

18. The circuit board device according to claim 1, wherein said functional block varies in thickness such that said functional block is thinner in a side facing said anisotropically conductive member.

19. A wiring board connecting method for electrically connecting a plurality of wiring boards, said method comprising:
    placing a first wiring board on a first holding block;
    placing an anisotropically conductive member and a functional block on said first wiring board so that a predetermined gap is provided between said anisotropically conductive member and said functional block;
    placing a second wiring board on said anisotropically conductive member and said functional block;
    placing additional wiring boards through one or more additional anisotropically conductive members and one or more additional functional blocks in a similar manner, so that one ore more additional predetermined gaps is provided between said one or more additional anisotropically conductive member and said one or more additional functional blocks;
    placing a second holding block on a topmost wiring board of the additional wiring boards; and
    clamping said first, second, and additional wiring boards, said anisotropically conductive member and said one or more additional anisotropically conductive members, and said functional block and said one or more additional functional blocks between said first holding block and said second holding block, and keeping them compressed.

20. A circuit board module device comprising:
    a plurality of individual functional module boards having a plurality of mounted parts surface mounted thereon;
    an anisotropically conductive member placed between each of said plurality of individual functional module boards;
    a functional block separate from said anisotropically conductive member, placed on both sides of said anisotropically conductive member in one direction or in a same plane as said anisotropically conductive member so as to surround the anisotropically conductive member; and
    a pair of holding blocks placed to clamp said plurality of individual functional module boards,
    wherein a predetermined gap is provided between said anisotropically conductive member and said functional block,
    wherein said plurality of individual functional module boards are compressed and held as clamped by said pair of holding blocks such that said plurality of individual functional module boards are electrically connected to each other by said anisotropically conductive member.

* * * * *